US012637752B2

(12) United States Patent
Kim et al.

(10) Patent No.: US 12,637,752 B2
(45) Date of Patent: May 26, 2026

(54) MASK ASSEMBLY AND METHOD OF MANUFACTURING THE MASK ASSEMBLY

(71) Applicant: Samsung Display Co., Ltd., Yongin-si (KR)

(72) Inventors: Seoyeon Kim, Yongin-si (KR); Mina Woo, Yongin-si (KR); Jongdae Lee, Yongin-si (KR); Hongkyun Ahn, Yongin-si (KR); Sangwoo Jo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 441 days.

(21) Appl. No.: 18/314,371

(22) Filed: May 9, 2023

(65) Prior Publication Data

US 2024/0018641 A1     Jan. 18, 2024

(30) Foreign Application Priority Data

Jul. 13, 2022     (KR) ........................ 10-2022-0086549

(51) Int. Cl.
*C23C 14/04*          (2006.01)

(52) U.S. Cl.
CPC .................................. *C23C 14/042* (2013.01)

(58) Field of Classification Search
None
See application file for complete search history.

(56) References Cited

U.S. PATENT DOCUMENTS

| | | | |
|---|---|---|---|
| 9,018,647 B2 | 4/2015 | Sung et al. | |
| 10,868,268 B2 | 12/2020 | Kim et al. | |
| 2014/0150721 A1* | 6/2014 | Oh ........................ | C23C 14/042 |
| | | | 118/504 |
| 2015/0047560 A1* | 2/2015 | Kang ................... | H10K 71/166 |
| | | | 118/504 |
| 2017/0179390 A1* | 6/2017 | Baek ..................... | C23C 14/042 |
| 2020/0002801 A1 | 1/2020 | Nakajima | |
| 2021/0265396 A1 | 8/2021 | Kim et al. | |
| 2021/0355572 A1 | 11/2021 | Li et al. | |

FOREIGN PATENT DOCUMENTS

| | | |
|---|---|---|
| CN | 108611596 | 10/2018 |
| KR | 1020140070255 A | 6/2014 |
| KR | 10-1678056 | 11/2016 |
| KR | 10-2020-0051107 | 5/2020 |
| KR | 10-2257213 | 5/2021 |
| KR | 1020210106616 A | 8/2021 |

* cited by examiner

*Primary Examiner* — Jason Berman

(74) *Attorney, Agent, or Firm* — CANTOR COLBURN LLP

(57) ABSTRACT

A mask assembly includes a mask frame having an opening area, and a mask sheet disposed on the mask frame to overlap the opening area, the mask sheet including a first area, and a second area surrounding the first area. The first area includes a first opening pattern that is a half-etched pattern, the second area includes a second opening pattern that is a penetrating pattern, and in a plan view, the first opening pattern and the second opening pattern are different from each other.

21 Claims, 17 Drawing Sheets

MASK ASSEMBLY AND METHOD OF MANUFACTURING THE MASK ASSEMBLY

CROSS-REFERENCE TO RELATED APPLICATION(S)

This application claims priority to and benefits of Korean Patent Application No. 10-2022-0086549 under 35 U.S.C. § 119, filed on Jul. 13, 2022 in the Korean Intellectual Property Office (KIPO), the entire contents of which are incorporated herein by reference.

BACKGROUND

1. Technical Field

One or more embodiments relate to a mask assembly and a method of manufacturing the mask assembly.

2. Description of the Related Art

Electronic devices have been widely used. Electronic devices have been variously used in mobile electronic devices and stationary electronic devices. Electronic devices include display devices that may provide users with visual information, such as images or videos, to support various functions.

As the area occupied by a region for displaying images in display devices increases, various functions integrated with or linked to display devices have been added. As a method for adding various functions, there is ongoing research on a display device having an area that performs various functions while also displaying images. An area for various functions while also displaying images needs to maintain high transmittance of light or sound in order to perform the functions.

Such a display device may be formed by stacking various layers, such as an organic layer and a metal layer. A deposition material may be deposited to form layers of the display device. The deposition material may be ejected from a deposition source and deposited on a substrate through a mask assembly.

In case that deformation of a mask assembly occurs, particularly in case that deformation of a mask sheet occurs, the deposition material is not deposited at a desired position on the substrate, and thus, deposition quality degrades.

The above-described background technology is information that the inventor possessed for the derivation of the disclosure or acquired in the process of deriving the disclosure, and it cannot be said that it is known technology disclosed to the public before the filing of the disclosure.

SUMMARY

One or more embodiments include a mask assembly with improved deposition quality by preventing deformation of the mask assembly and a method of manufacturing the mask assembly.

However, such an aspect is merely an example. Aspects are not limited thereby.

Additional aspects will be set forth in part in the description which follows and, in part, will be apparent from the description, or may be learned by practice of the presented embodiments of the disclosure.

According to one or more embodiments, a mask assembly may include a mask frame including an opening area, and a mask sheet disposed on the mask frame to overlap the opening area, the mask sheet including a first area, and a second area surrounding the first area. The first area may include a first opening pattern that is a half-etched pattern, the second area may include a second opening pattern that is a penetrating pattern, and in a plan view, the first opening pattern and the second opening pattern may be different from each other.

The first opening pattern may include a plurality of first ribs extending in a first direction, a plurality of second ribs extending in a second direction, and a plurality of half openings defined by the plurality of first ribs and the plurality of second ribs. The second opening pattern may include a plurality of third ribs extending in a third direction, a plurality of fourth ribs extending in a fourth direction, and a plurality of openings defined by the plurality of third ribs and the plurality of fourth ribs. The third direction may be a direction intersecting with the first direction and the second direction.

The fourth direction may be a direction intersecting with the first direction and the second direction.

An angle between the first direction in which the plurality of first ribs extend and the third direction in which the plurality of third ribs extend may be 45°.

A direction in which the plurality of half openings are aligned and a direction in which the plurality of openings are aligned may be different from each other.

The plurality of half openings may be aligned in the first direction and the second direction, and the plurality of openings may be aligned in the third direction and the fourth direction.

From among distances between centers of any two half openings among the plurality of half openings, the distance between centers of two half openings adjacent to each other in at least one of the first direction and the second direction may be a shortest distance. From among distances between centers of any two openings among the plurality of openings, the distance between centers of two openings adjacent to each other in at least one of the third direction and the fourth direction may be a shortest distance.

In a plan view, shapes of the plurality of half openings and shapes of the plurality of openings may be different from each other.

The shapes of the plurality of half openings may be circular.

In a plan view, sizes of the plurality of half openings and sizes of the plurality of openings may be different from each other.

In a plan view, a number of first ribs per unit area and a number of third ribs per unit area may be different from each other.

In a plan view, a number of second ribs per unit area and a number of fourth ribs per unit area may be different from each other.

According to one or more embodiments, a method of manufacturing a mask assembly may include preparing a mask sheet including a first area and a second area surrounding the first area, forming a first opening pattern, which is a half-etched pattern, in the first area, forming a second opening pattern, which is a penetrating pattern, in the second area, and tensioning the mask sheet and fixing the mask sheet onto a mask frame. In a plan view, the first opening pattern and the second opening pattern may be different from each other.

The forming of the first opening pattern may include forming a plurality of first ribs extending in a first direction, a plurality of second ribs extending in a second direction, and a plurality of half openings defined by the plurality of first ribs and the plurality of second ribs. The forming of the second opening pattern may include forming a plurality of third ribs extending in a third direction, a plurality of fourth ribs extending in a fourth direction, and a plurality of openings defined by the plurality of third ribs and the plurality of fourth ribs. The third direction may be a direction intersecting with the first direction and the second direction.

A direction in which the mask sheet is tensioned and a direction in which the plurality of first ribs extend may be same.

A direction in which the mask sheet is tensioned may be perpendicular to a direction in which the plurality of second ribs extend.

A direction in which the mask sheet is tensioned may intersect with a direction in which the plurality of third ribs extend.

An angle between the direction in which the mask sheet is tensioned and the direction in which the plurality of third ribs extend may be 45°.

A direction in which the plurality of half openings are aligned and a direction in which the plurality of openings are aligned may be different from each other.

In a plan view, shapes of the plurality of half openings and shapes of the plurality of openings may be different from each other.

In a plan view, a number of first ribs per unit area and a number of third ribs per unit area may be different from each other.

Other aspects, features, and advantages than those described above will become apparent from the following drawings, claims, and detailed descriptions to embody the disclosure below.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 2A and 2B are schematic cross-sectional views illustrating a portion of a cross-section of a display device according to an embodiment;

DETAILED DESCRIPTION OF THE EMBODIMENTS

Figure 1A:
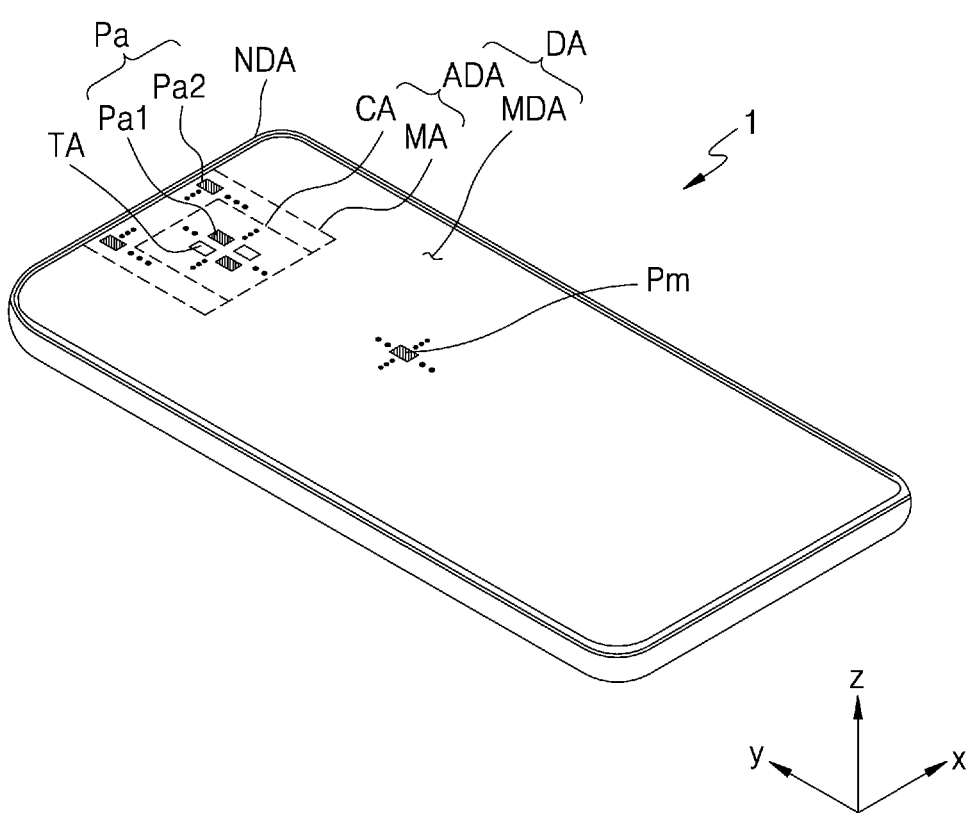
FIGS. 1A and 1B are schematic perspective views illustrating a display device according to an embodiment.

Reference will now be made in detail to embodiments, examples of which are illustrated in the accompanying drawings, wherein like reference numerals refer to like elements throughout. The embodiments may have different forms and should not be construed as being limited to the descriptions set forth herein. Accordingly, the embodiments are merely described below, by referring to the figures, to explain aspects of the description.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

While such terms as "first" and "second" may be used to describe various components, such components must not be limited to the above terms. The above terms are used only for purposes of distinguishing one component from another.

The singular forms "a," "an," and "the" as used herein are intended to include the plural forms as well unless the context clearly indicates otherwise.

It will be understood that the terms "comprise," "comprising," "has," "have," "having," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. For example, intervening layers, regions, or components may be present.

Sizes of elements in the drawings may be exaggerated or reduced for convenience of description. As an example, the size and thickness of each element shown in the drawings may be arbitrarily represented for convenience of description, and thus, the disclosure is not necessarily limited thereto.

The X-axis, the Y-axis and the Z-axis are not limited to three axes of the rectangular coordinate system, and may be interpreted in a broader sense. For example, the X-axis, the Y-axis, and the Z-axis may be perpendicular to one another, or may represent different directions that are not perpendicular to one another.

In some embodiments, a specific process order may be performed in an order different from the described order. As an example, two processes successively described may be simultaneously performed substantially or may be performed in an opposite order.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

It will be understood that the terms "connected to" or "coupled to" may include a physical and/or electrical connection or coupling.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
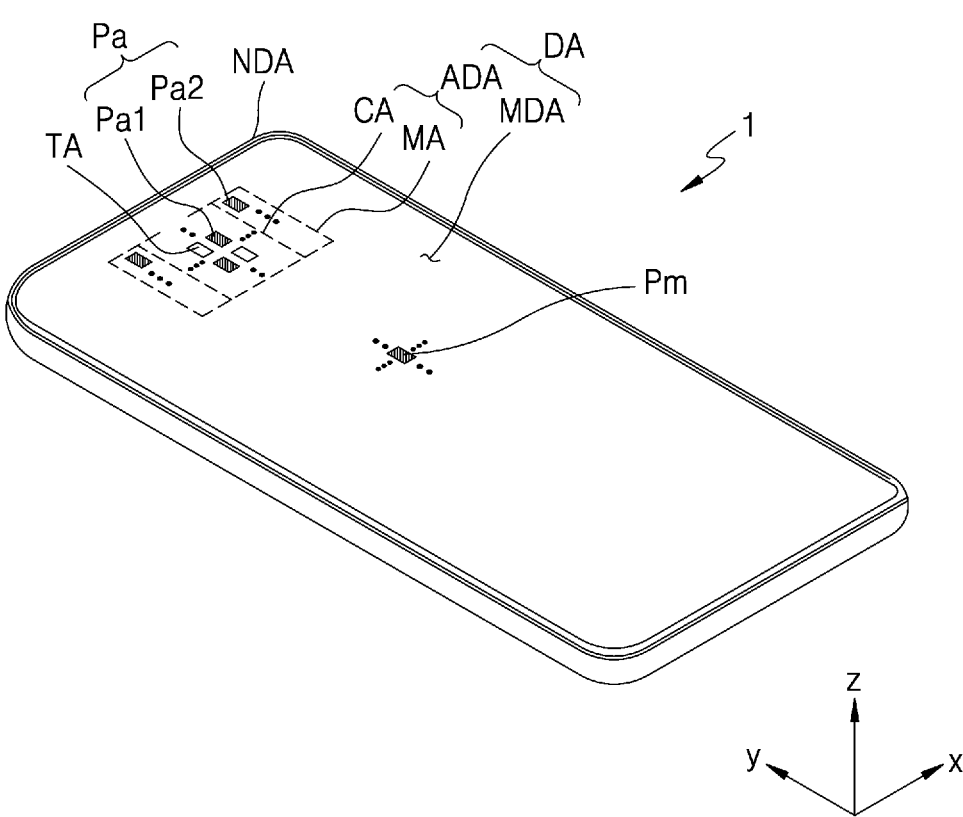

FIGS. 1A and 1B are schematic perspective views illustrating a display device 1 according to an embodiment.

The display device 1 according to an embodiment may display a moving image or still image and may be used as a display screen in various products including televisions, notebook computers, monitors, advertisement boards, Internet of things (IoT) apparatuses as well as portable electronic apparatuses including mobile phones, smart phones, tablet personal computers (PC), mobile communication terminals, electronic organizers, electronic books, portable multimedia players (PMP), navigations, and ultra-mobile personal computers (UMPCs). The display device 1 according to an embodiment may be used in wearable devices including smartwatches, watchphones, glasses-type displays, and head-mounted displays (HMD). The display device 1 according to an embodiment may be used as a dashboard of a vehicle, a center information display (CID) disposed on a center fascia or dashboard of a vehicle, a room mirror display replacing a side mirror of a vehicle, entertainment for a back seat of a vehicle, and a display disposed on the back of a front seat of a vehicle. FIGS. 1A and 1B illustrate examples in which the display device 1 is used as a smartphone for convenience of description.

Referring to FIGS. 1A and 1B, the display device 1 may include a display area DA and a non-display area NDA outside the display area DA. The display area DA may include an auxiliary display area ADA and a main display area MDA that at least partially surrounds the auxiliary display area ADA. The auxiliary display area ADA may display an auxiliary image, the main display area MDA may display a main image, and the auxiliary display area ADA and the main display area MDA may display images individually or together. The display area DA may be entirely surrounded by the non-display area NDA.

FIGS. 1A and 1B illustrate that the main display area MDA may surround at least a portion of one component area CA. In another embodiment, the display device 1 may have two or more auxiliary display areas ADA, and the shapes and sizes of the two or more auxiliary display areas ADA may be different from each other. When viewed in a direction substantially perpendicular to the upper surface of the display device 1 (e.g., in a plan view), the auxiliary display area ADA may have various shapes, such as a polygonal shape, such as a circle, an oval, or a quadrangle, a star shape, or diamond shape.

It is illustrated in FIGS. 1A and 1B that the auxiliary display area ADA is located at the upper center (i.e., a +y direction) of the main display area MDA having a substantially rectangular shape when viewed in a direction approximately perpendicular to the upper surface of the display device 1 (in a plan view). However, the auxiliary display area ADA may be disposed on a side of the main display area MDA having a rectangular shape, for example, on the upper right side or the upper left side of the main display area MDA.

The display device 1 may provide an image by using main sub-pixels Pm located in the main display area MDA and auxiliary sub-pixels Pa located in the auxiliary display area ADA. The auxiliary display area ADA may include a component area CA and an intermediate area MA that at least partially surrounds the component area CA. Accordingly, the intermediate area MA may be located between the component area CA and the main display area MDA.

In FIGS. 1A and 1B, the auxiliary display area ADA may be implemented in various shapes. A side of the auxiliary display area ADA may extend to contact the non-display area NDA, as shown in FIG. 1A, or may be located inside the main display area MDA, as shown in FIG. 1B. In the component area CA, as described below with reference to FIG. 2A, a component 40 (see FIG. 2A), which is an electronic element, may be located under a display panel to correspond to the component area CA. The component area CA may include a transmissive area TA through which light and/or sound output from the component 40 to the outside or traveling from the outside toward the component 40 may pass.

Auxiliary sub-pixels Pa may be located in the auxiliary display area ADA. Each of the auxiliary sub-pixels Pa may include a first auxiliary sub-pixel Pa1 located in the component area CA and a second auxiliary sub-pixel Pa2 located in the intermediate area MA.

The auxiliary sub-pixels Pa may emit light to provide a certain image. An image displayed in the auxiliary display area ADA may have a resolution that is the same as or less than that of an image displayed in the main display area MDA. In an embodiment, because the component area CA has the transmissive area TA, the resolution of the component area CA may be less than that of the main display area MDA. For example, the resolution of the component area CA may be about ½, about ⅜, about ⅓, about ¼, about 2/9, about ⅛, about ⅑, about 1/16, or the like of the resolution of the main display area MDA. For example, the resolution of the main display area MDA may be about 400 ppi or more, and the resolution of the component area CA may be about 200 ppi or about 100 ppi.

In an embodiment, because the component area CA in the auxiliary display area ADA includes the transmissive area TA through which light and sound may pass, in case that sub-pixels are not located in the transmissive area TA, the number of first auxiliary sub-pixels Pa1 that may be located per unit area may be less than the number of main sub-pixels Pm that may be located per unit area in the main display area MDA.

Figure 2A:
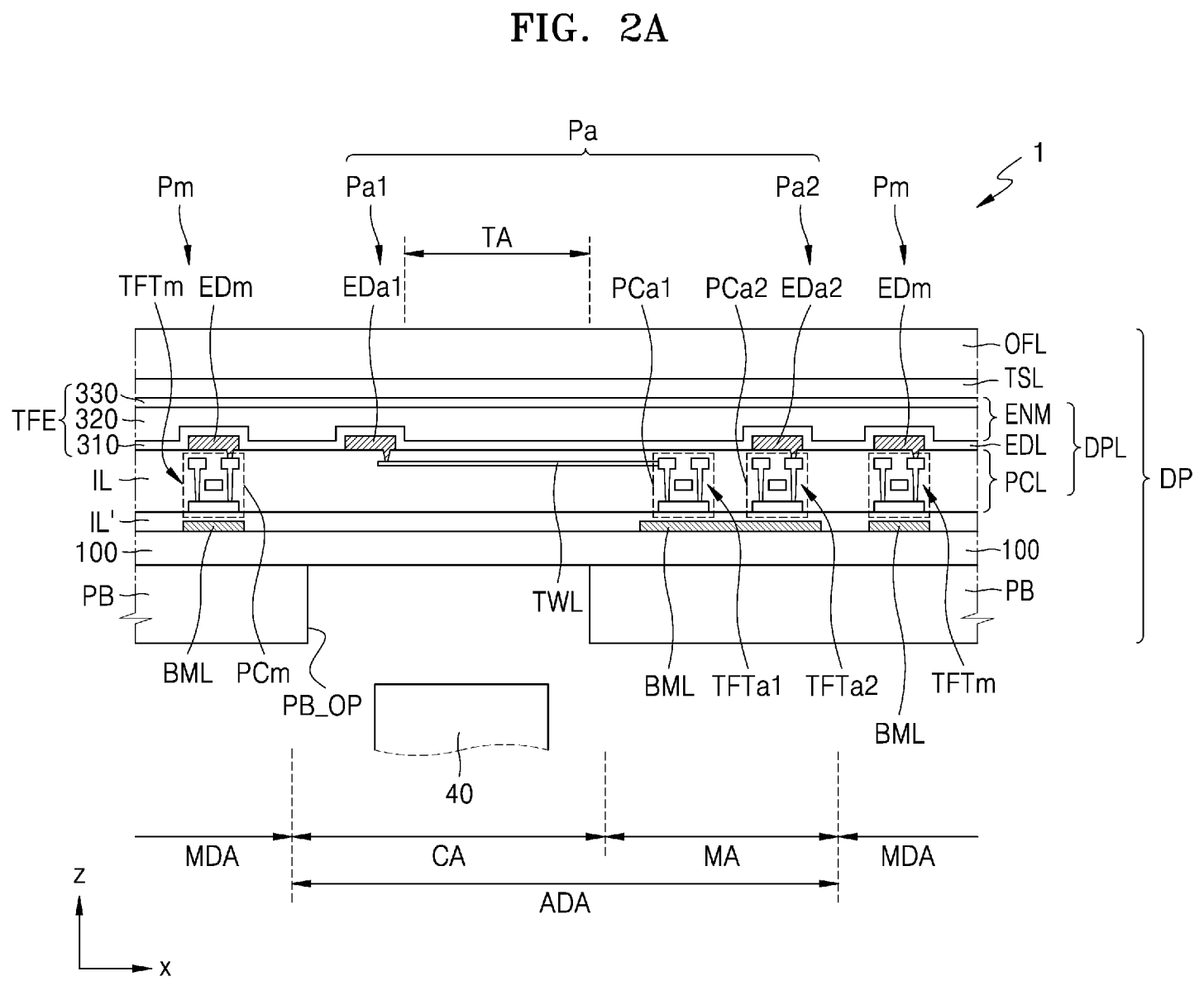
Figure 2B:
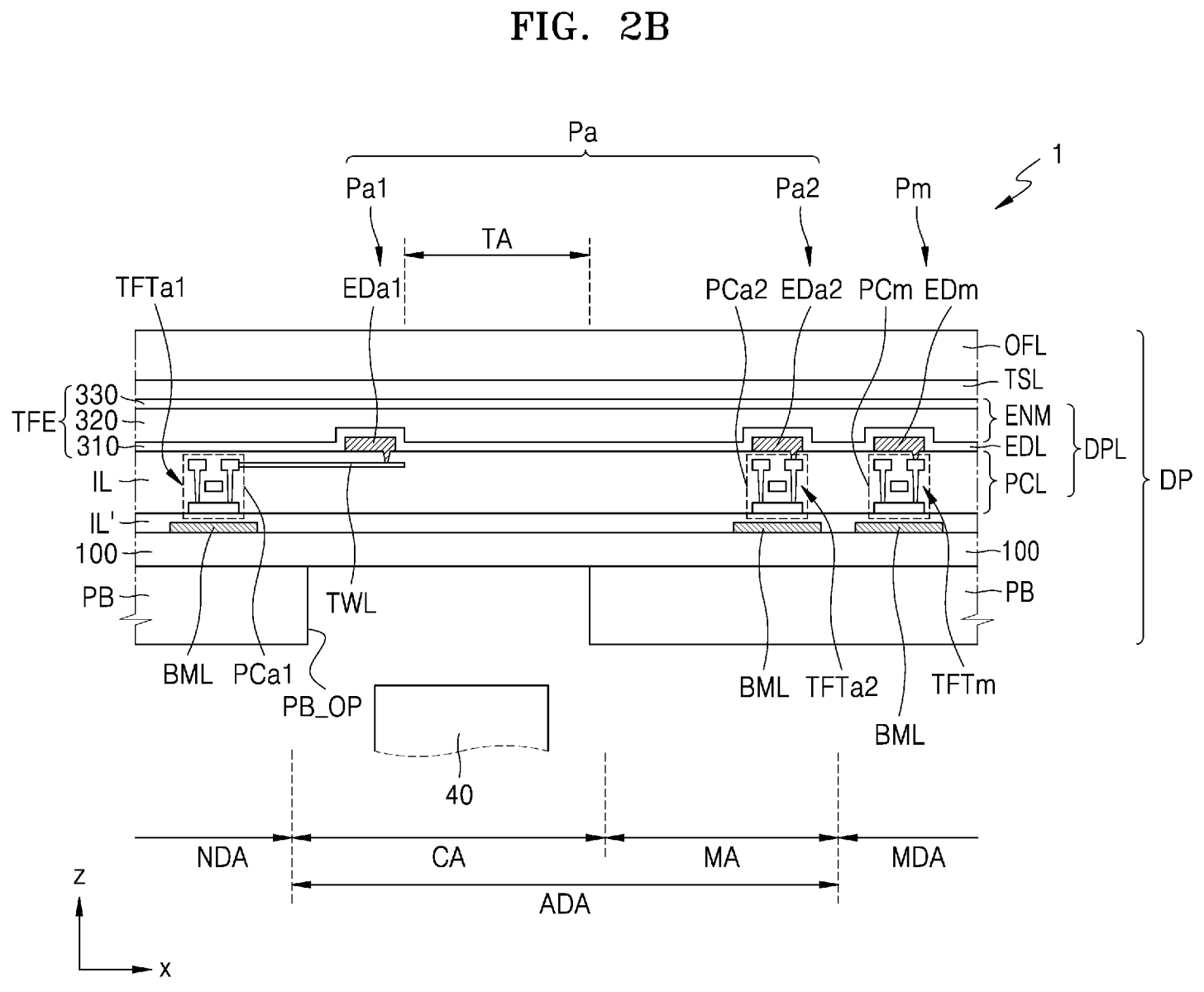

FIGS. 2A and 2B are schematic cross-sectional views illustrating a portion of a cross-section of a display device 1 according to an embodiment.

Referring to FIGS. 2A and 2B, the display device 1 may include a display panel DP and a component 40 overlapping the display panel DP.

The component 40 may be an electronic element using light or sound. For example, the electronic element may be a sensor that measures a distance, such as a proximity sensor, a sensor that recognizes a portion (e.g., fingerprint, iris, face, etc.) of a user's body, a small lamp that outputs light, and/or an image sensor (e.g., a camera) that captures images. An electronic element using light may use light of various wavelength bands, such as visible light, infrared light, and ultraviolet light. An electronic element using sound may use ultrasound or sound in other frequency bands. In some embodiments, the component 40 may include sub-components, such as a light-emitting portion and a light-receiving portion. The light-emitting portion and the light-receiving portion may be in an integrated structure. In other embodiments, a light-emitting portion and a light-receiving portion, which are physically separated from each other and are paired, may form one component 40.

In order for light to transmit through the component area CA, light transmittance may be about 10% or more, in an embodiment about 40% or more, about 25% or more, about 50% or more, about 85% or more, or about 90% or more.

The display panel DP may include an auxiliary display area ADA in which an auxiliary image is displayed and a main display area MDA in which a main image is displayed. The auxiliary display area ADA may include a component area CA, which is an area overlapping the component 40, and an intermediate area MA surrounding the component area CA.

The display panel DP may include a substrate 100, a display layer DPL on the substrate 100, a touch screen layer TSL, and an optical function layer OFL.

The display layer DPL may include a display circuit layer PCL including thin-film transistors TFTm, TFTa1, and TFTa2, a display element layer EDL including display elements EDm, EDa1, and EDa2 that are light-emitting devices, and a sealing member ENM, such as a thin-film encapsulation layer TFE or a sealing substrate (not shown). An insulating layer IL' may be located between the substrate 100 and the display layer DPL, and an insulating layer IL may be located in the display layer DPL. For example, each of the display elements EDm, EDa1, and EDa2 may include a light-emitting diode, and in an embodiment, the light-emitting diode may be an organic light-emitting diode. Hereinafter, although it is described that the light-emitting diode includes an organic light-emitting diode, the disclosure is not limited thereto. In another embodiment, each of the display elements EDm, EDa1, and EDa2 may be a light-emitting diode including an inorganic material or a quantum dot light-emitting diode including quantum dots. For example, an emission layer of each of the display elements EDm, EDa1, and EDa2 may include an organic material, an inorganic material, quantum dots, an organic material and quantum dots, or an inorganic material and quantum dots.

The substrate 100 may include an insulating material, such as glass, quartz, and/or polymer resin. The substrate 100 may be a rigid substrate, or a flexible substrate that is bendable, foldable, and/or rollable.

A main display element EDm and a main sub-pixel circuit PCm connected thereto may be located in the main display area MDA of the display panel DP. The main sub-pixel circuit PCm may include at least one thin-film transistor TFTm, and may control the operation of the main display element EDm. A main sub-pixel Pm may be implemented by light emission of the main display element EDm.

A first auxiliary display element EDa1 may be located in the component area CA of the display panel DP to implement a first auxiliary sub-pixel Pa1. In an embodiment, as shown in FIG. 2A, a first auxiliary sub-pixel circuit PCa1 driving the first auxiliary display element EDa1 may not be located in the component area CA, but may be located in the intermediate area MA between the main display area MDA and the component area CA. In another embodiment, as shown in FIG. 2B, the first auxiliary sub-pixel circuit PCa1 driving the first auxiliary display element EDa1 may not be located in the component area CA but may be located in the non-display area NDA. For example, the first auxiliary sub-pixel circuit PCa1 may be located so as not to overlap the first auxiliary display element EDa1.

The first auxiliary sub-pixel circuit PCa1 may include at least one first auxiliary thin-film transistor TFTa1, and may be electrically connected to the first auxiliary display element EDa1 by a connection line TWL. The connection line TWL may include a transparent conductive material. The first auxiliary sub-pixel circuit PCa1 may control the operation of the first auxiliary display element EDa1. The first auxiliary sub-pixel Pa1 may be implemented by light emission of the first auxiliary display element EDa1.

An area in the component area CA, in which the first auxiliary display element EDa1 is not located, may be defined as a transmissive area TA. The transmissive area TA may be an area through which light/signal emitted from the component 40 located to correspond to the component area CA and/or light/signal incident to the component 40 are transmitted.

The connection line TWL connecting the first auxiliary sub-pixel circuit PCa1 to the first auxiliary display element EDa1 may be located in the transmissive area TA. Because the connection line TWL may include a transparent conductive material having high transmittance, the transmittance of the transmissive area TA may be secured even in case that the connection line TWL is located in the transmissive area TA. In an embodiment, because the auxiliary sub-pixel circuit PCa is not located in the component area CA, the area of the transmissive area TA may be readily expanded and light transmittance may be further improved.

A second auxiliary display element EDa2 and a second auxiliary sub-pixel circuit PCa2 connected thereto may be located in the intermediate area MA of the display panel DP to implement the second auxiliary sub-pixel Pa2. The first auxiliary sub-pixel circuit PCa1 and the second auxiliary sub-pixel circuit PCa2 located in the intermediate area MA may be adjacent to each other and may be alternately located.

The display element layer EDL may be covered with the thin-film encapsulation layer TFE, as shown in FIGS. 2A and 2B, or may be covered with a sealing substrate. In an embodiment, the thin-film encapsulation layer TFE may include at least one inorganic encapsulation layer and at least one organic encapsulation layer. For example, the thin-film encapsulation layer TFE may include first and second inorganic encapsulation layers 310 and 330 and an organic encapsulation layer 320 therebetween.

The first inorganic encapsulation layer 310 and the second inorganic encapsulation layer 330 may each include one or more inorganic insulating materials, such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$), and may be formed by chemical vapor deposition (CVD) or the like. The organic encapsulation layer 320 may include a polymer-based material. Examples of the polymer-based material may include silicone-based resin, acrylic resin (e.g., polymethyl methacrylate or polyacrylic acid), epoxy-based resin, polyimide, and/or polyethylene.

The first inorganic encapsulation layer 310, the organic encapsulation layer 320, and the second inorganic encapsulation layer 330 may be integrally formed to cover the main display area MDA and the auxiliary display area ADA.

The touch screen layer TSL may acquire coordinate information according to an external input, for example, a touch event. The touch screen layer TSL may include a touch electrode and touch wiring lines connected to the touch electrode. The touch screen layer TSL may sense an external input by using a self-capacitance method or a mutual capacitance method.

The touch screen layer TSL may be formed on the thin-film encapsulation layer TFE. In other embodiments, the touch screen layer TSL may be separately formed on a touch substrate, and combined onto the thin-film encapsulation layer TFE through an adhesive layer, such as an optically clear adhesive (OCA). In an embodiment, the touch screen layer TSL may be directly formed on the thin-film encapsulation layer TFE. The adhesive layer may not be between the touch screen layer TSL and the thin-film encapsulation layer TFE.

The optical function layer OFL may include an anti-reflection layer. The anti-reflection layer may reduce the reflectance of light (external light) incident toward the display device 1 from the outside. In an embodiment, the optical function layer OFL may be a polarizing film. In another embodiment, the optical function layer OFL may include an opening (not shown) corresponding to the transmissive area TA. Accordingly, the light transmittance of the transmissive area TA may be remarkably improved. The opening may be filled with a transparent material, such as an optically clear resin (OCR). In another embodiment, the optical function layer OFL may include a filter plate including a black matrix and color filters.

A panel protection member PB may be attached to a lower surface of the substrate 100 to support and protect the substrate 100. The panel protection member PB may have an opening PB_OP corresponding to the component area CA. As the panel protection member PB has the opening PB_OP, the light transmittance of the component area CA may be improved. The panel protection member PB may include polyethylene terephthalate or polyimide. The area of the component area CA may be greater than an area in which the component 40 is located. Accordingly, the area of the opening PB_OP provided in the panel protection member PB may not match the area of the component area CA. Although FIGS. 2A and 2B illustrate that the component 40 is located to be apart from a side of the display panel DP, at least a portion of the component 40 may be inserted into the opening PB_OP provided in the panel protection member PB.

One or more components 40 may be located in the component area CA. The components 40 may have different functions from each other. For example, the components 40 may include at least one of a camera (an imaging device), a solar cell, a flash, a proximity sensor, an illuminance sensor, and an iris sensor.

As shown in FIGS. 2A and 2B, a bottom metal layer BML may be located under the first auxiliary sub-pixel circuit PCa1 and/or the second auxiliary sub-pixel circuit PCa2 in the intermediate area MA. The bottom metal layer BML may overlap sub-pixel circuits to protect the sub-pixel circuits. In an embodiment, the bottom metal layer BML may be located between the substrate 100 corresponding to the intermediate area MA and the first auxiliary sub-pixel circuit PCa1 and/or the second auxiliary sub-pixel circuit PCa2 to overlap the first auxiliary sub-pixel circuit PCa1 and/or the second auxiliary sub-pixel circuit PCa2. The bottom metal layer BML may block external light from reaching the first auxiliary sub-pixel circuit PCa1 and/or the second auxiliary sub-pixel circuit PCa2. Also, the bottom metal layer BML may be located under the main sub-pixel circuit Pm of the main display area MDA. A bottom metal layer BML located under the main sub-pixel circuit Pm may be apart from a bottom metal layer BML located under the first auxiliary sub-pixel circuit PCa1 and/or the second auxiliary sub-pixel circuit PCa2. In another embodiment, the bottom metal layer BML may be formed to correspond to the entire display area DA and may have a lower hole corresponding to the component area CA. In another embodiment, the bottom metal layer BML may be omitted.

Figure 3A:
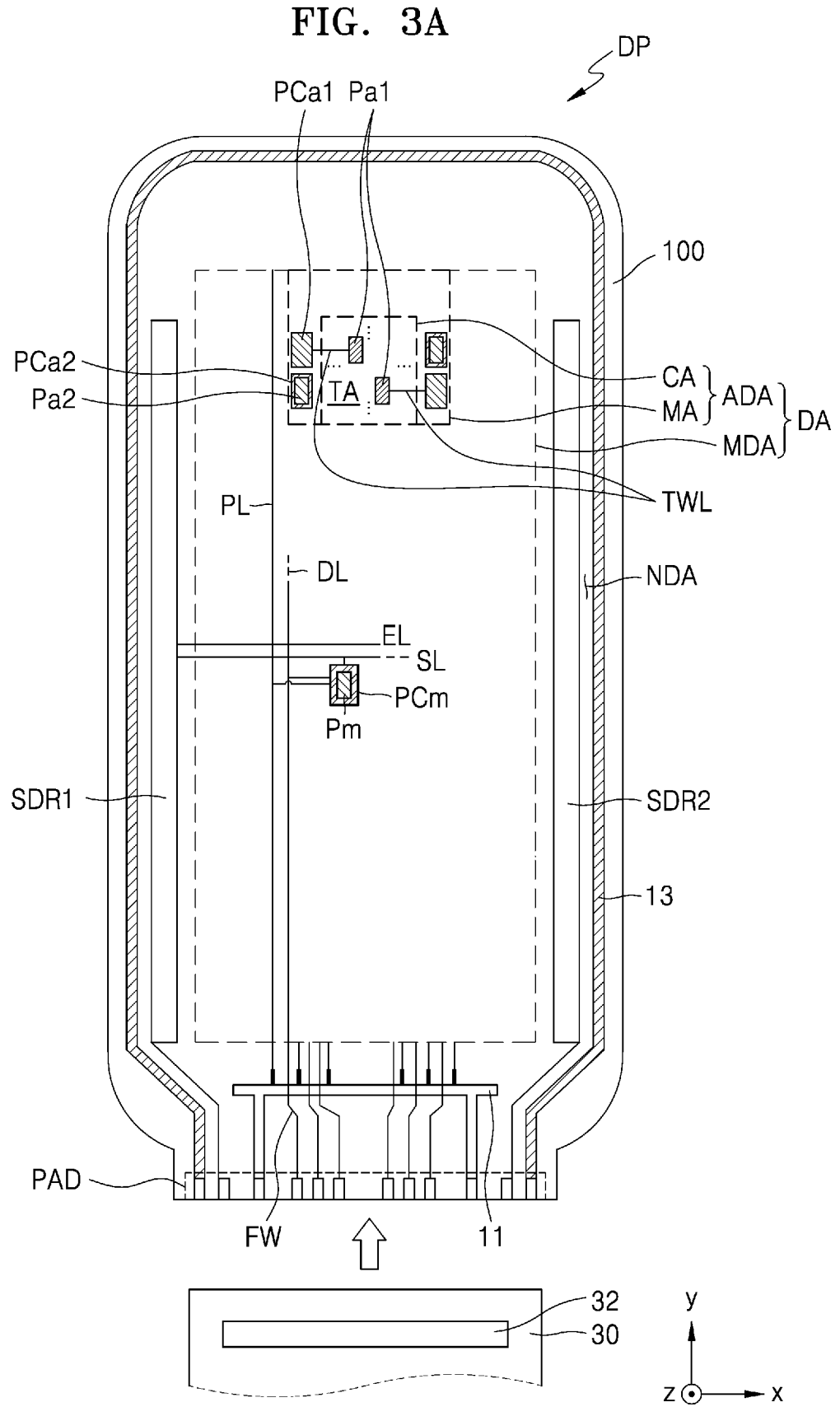
FIGS. 3A and 3B are schematic plan views illustrating a display panel of a display device according to an embodiment.
Figure 3B:
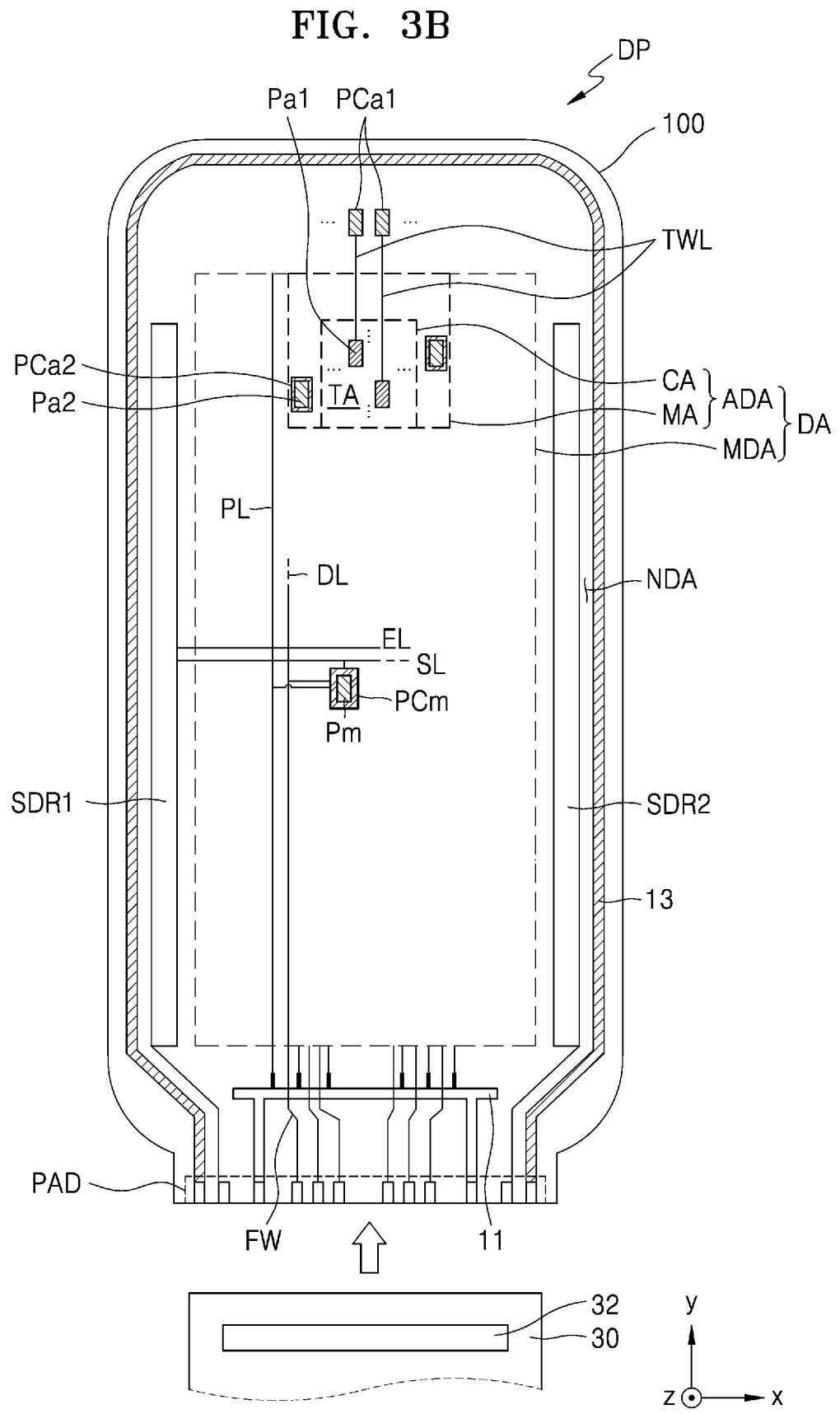

FIGS. 3A and 3B are schematic plan views illustrating a display panel DP provided in a display device according to an embodiment.

Referring to FIGS. 3A and 3B, various components constituting the display panel DP may be disposed on a substrate 100.

Multiple main sub-pixels Pm may be located in a main display area MDA. Each of the main sub-pixels Pm may be implemented as a light-emitting device by a display element, such as an organic light-emitting diode. A main sub-pixel circuit PCm driving the main sub-pixel Pm may be located in the main display area MDA, and the main sub-pixel circuit PCm may overlap the main sub-pixel Pm. Each of the main sub-pixels Pm may emit, for example, red, green, blue, or white light. The main display area MDA may be covered with a sealing member and be protected from external air or moisture.

As described above, an auxiliary display area ADA may be disposed on a side of the main display area MDA or may be located inside a display area DA and surrounded by the main display area MDA. Multiple auxiliary sub-pixels Pa1 and Pa2 may be located in the auxiliary display area ADA. Each of the auxiliary sub-pixels Pa1 and Pa2 may be implemented as a light-emitting device by a display element, such as an organic light-emitting diode. Each of the auxiliary sub-pixels Pa1 and Pa2 may emit, for example, red, green, blue, or white light. An auxiliary display area ADA may be covered with a sealing member and be protected from external air or moisture.

The auxiliary display area ADA may include a component area CA and an intermediate area MA that at least partially surrounds the component area CA. A first auxiliary sub-pixel Pa1 may be implemented on the component area CA, and a second auxiliary sub-pixel Pa2 may be implemented on the intermediate area MA. This may mean that the first auxiliary sub-pixel Pa1 substantially emits light in the component area CA, and the second auxiliary sub-pixel Pa2 substantially emits light in the intermediate area MA.

Referring to FIG. 3A, because a first auxiliary display element EDa1 (see FIG. 2A) implementing the first auxiliary sub-pixel Pa1 is located in the component area CA and the first auxiliary sub-pixel circuit PCa1 is located in the intermediate area MA, the first auxiliary display element EDa1 (see FIG. 2A) and the first auxiliary sub-pixel circuit PCa1 may be connected to each other by a connection line TWL.

In another embodiment, referring to FIG. 3B, because a first auxiliary display element EDa1 (see FIG. 2B) implementing the first auxiliary sub-pixel Pa1 is located in the component area CA and the first auxiliary sub-pixel circuit PCa1 is located in the non-display area NDA, the first auxiliary display element EDa1 (see FIG. 2B) and the first auxiliary sub-pixel circuit PCa1 may be connected to each other by a connection line TWL.

Referring to FIGS. 3A and 3B, the first auxiliary display element EDa1 (see FIG. 2A) may be located in the component area CA, but the first auxiliary sub-pixel circuit PCa1 electrically connected to the first auxiliary display element EDa1 (see FIG. 2A) may not be located in the component area CA. As a comparative example of the disclosure, in case that the first auxiliary sub-pixel circuit PCa1 including transistors and storage capacitors connected to various types of signal lines and voltage lines is located in the component area CA, it may be difficult to sufficiently secure the area of the transmissive area TA due to the existence of the first auxiliary sub-pixel circuit PCa1. However, according to an embodiment, by arranging the first auxiliary sub-pixel circuit PCa1 in the intermediate area MA or the non-display area NDA and arranging the first auxiliary display element EDa1 (see FIG. 2A) in the component area CA, the area of the transmissive area TA may increase while maintaining the resolution in the component area CA.

The sub-pixel circuits PCm, PCa1, and PCa2 respectively driving the sub-pixels Pm, Pa1, and Pa2 on the display area DA may be electrically connected to external circuits located in the non-display area NDA. A first scan driving circuit SDR1, a second scan driving circuit SDR2, a terminal portion PAD, a driving voltage supply line 11, and a common voltage supply line 13 may be located in the non-display area NDA.

The first scan driving circuit SDR1 may apply a scan signal to the main sub-pixel circuit PCm, which drives the main sub-pixel Pm, through the scan line SL. Also, the first scan driving circuit SDR1 may apply an emission control signal to each pixel circuit through an emission control line EL. The second scan driving circuit SDR2 may be located symmetrically with the first scan driving circuit SDR1 with respect to the main display area MDA. Some of the main sub-pixel circuits PCm corresponding to the main sub-pixels Pm of the main display area MDA may be electrically connected to the first scan driving circuit SDR1, and the rest of the main sub-pixel circuits PCm may be electrically connected to the second scan driving circuit SDR2.

The terminal portion PAD may be disposed on a side of the substrate 100. The terminal portion PAD may be exposed without being covered by an insulating layer and may be connected to a display circuit board 30. A display driver 32 may be disposed on the display circuit board 30.

The display driver 32 may generate a control signal transmitted to the first scan driving circuit SDR1 and the second scan driving circuit SDR2. The display driver 32 may generate a data signal, and the generated data signal may be transmitted to the main sub-pixel circuit PCm through a fan-out line FW and a data line DL connected to the fan-out line FW.

The display driver 32 may supply a driving voltage ELVDD to the driving voltage supply line 11 and may supply a common voltage ELVSS to the common voltage supply line 13. The driving voltage ELVDD may be applied to pixel circuits of the sub-pixels Pm and Pa through the driving voltage line PL connected to the driving voltage supply line 11, and the common voltage ELVSS may be applied to opposite electrodes of display elements through the common voltage supply line 13.

The driving voltage supply line 11 may extend in an x direction from the lower side of the main display area MDA.

The common voltage supply line 13 may have a loop shape with a side open, and may partially surround the main display area MDA.

Figure 4:
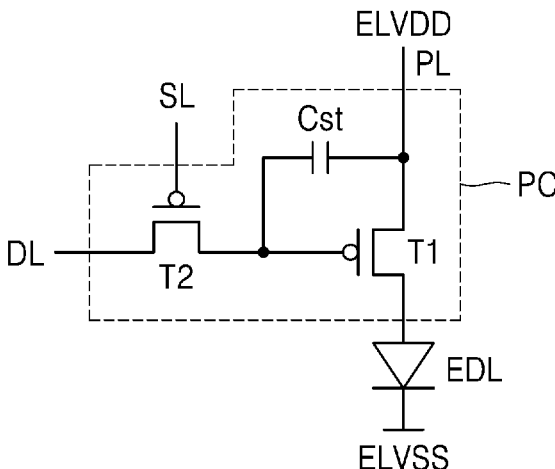
FIG. 4 is a schematic equivalent circuit diagram illustrating a display element and a sub-pixel circuit electrically connected thereto of a display device according to an embodiment.

FIG. 4 is a schematic equivalent circuit diagram illustrating a display element EDL and a sub-pixel circuit PC electrically connected thereto of a display device according to an embodiment.

The sub-pixel circuit PC shown in FIG. 4 may correspond to each of the main sub-pixel circuit PCm, the first auxiliary sub-pixel circuit PCa1, and the second auxiliary sub-pixel circuit PCa2 described above with reference to FIGS. 3A and 3B.

The display element EDL illustrated in FIG. 4 may correspond to each of the main display element EDm, the first auxiliary display element EDa1, and the second auxiliary display element EDa2 described above with reference to FIGS. 2A and 2B. In an embodiment, the display element EDL may be an organic light-emitting diode.

Referring to FIG. 4, the sub-pixel circuit PC may include a driving thin-film transistor T1, a switching thin-film transistor T2, and a storage capacitor Cst.

The switching thin-film transistor T2 may be electrically connected to a scan line SL and a data line DL, and may be configured to transfer, to the driving thin-film transistor T1, a data signal or data voltage inputted from the data line DL, based on a scan signal or switching voltage inputted from the scan line SL. The storage capacitor Cst may be electrically connected to the switching thin-film transistor T2 and a driving voltage line PL, and may store a voltage corresponding to a difference between a voltage received from the switching thin-film transistor T2 and a driving voltage ELVDD supplied to the driving voltage line PL.

The driving thin-film transistor T1 may be electrically connected to the driving voltage line PL and the storage capacitor Cst, and may be configured to control a driving current flowing through the display element EDL from the driving voltage line PL in response to a voltage value stored in the storage capacitor Cst. The display element EDL may emit light having a certain luminance according to the driving current. An opposite electrode of the display element EDL may be supplied with a common voltage ELVSS.

Although FIG. 4 illustrates that the sub-pixel circuit PC includes two thin-film transistors and one storage capacitor, the sub-pixel circuit PC may include three or more thin-film transistors.

Figure 5:
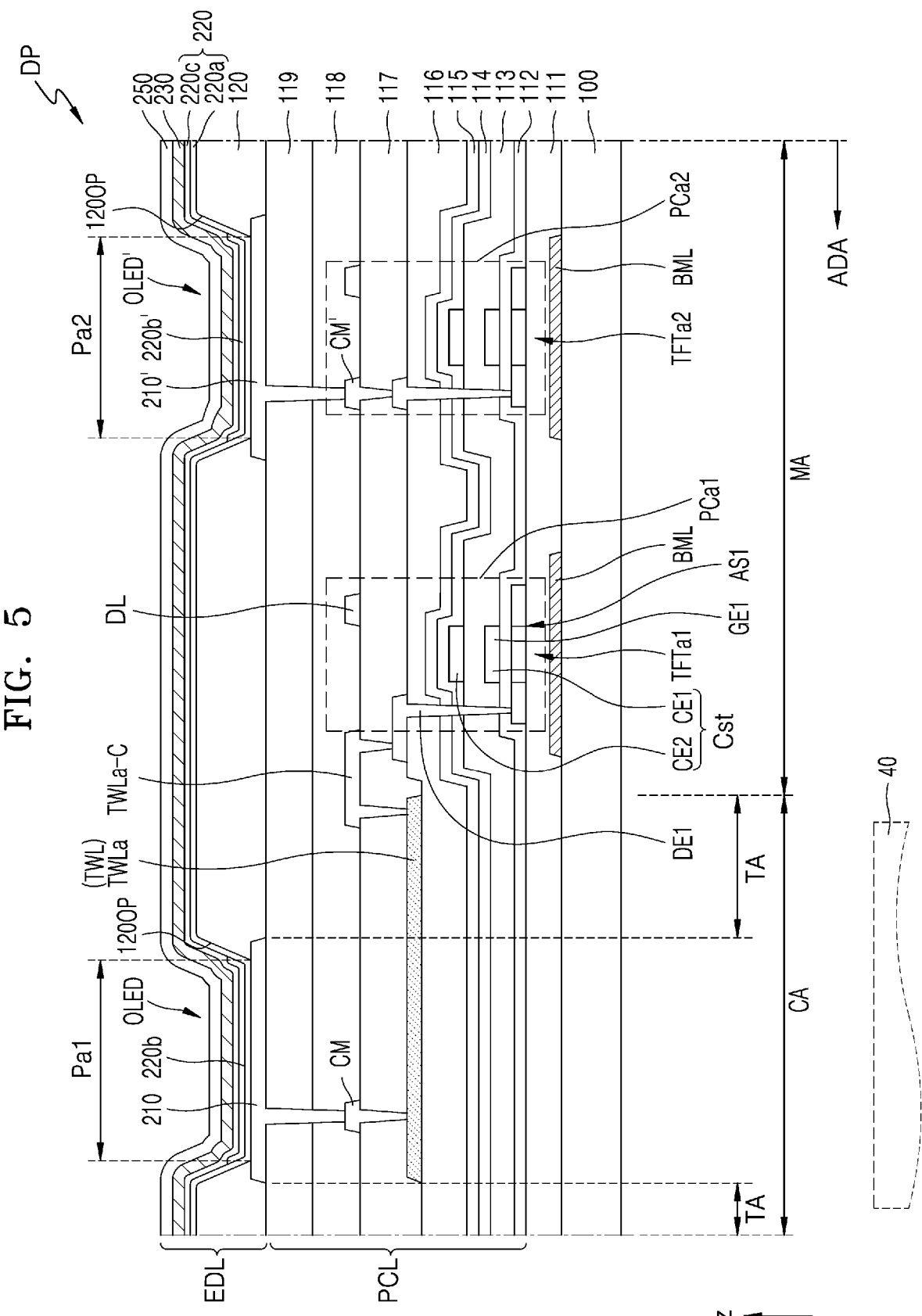
FIG. 5 is a schematic cross-sectional view illustrating a portion of a display panel according to an embodiment.

FIG. 5 is a schematic cross-sectional view illustrating a portion of a display panel DP according to an embodiment.

Referring to FIG. 5, a first auxiliary sub-pixel Pa1 may be disposed on the component area CA of the auxiliary display area ADA, and a second auxiliary sub-pixel Pa2 may be disposed on the intermediate area MA of the auxiliary display area ADA. The first auxiliary sub-pixel Pa1 may correspond to an emission area of a display element corresponding to the first auxiliary sub-pixel Pa1, for example, an organic light-emitting diode OLED, and the second auxiliary sub-pixel Pa2 may correspond to an emission area of a display element corresponding to the second auxiliary sub-pixel Pa2, for example, an organic light-emitting diode OLED'.

A first auxiliary sub-pixel circuit PCa1 and a second auxiliary sub-pixel circuit PCa2 may be disposed on the intermediate area MA. The first auxiliary sub-pixel circuit PCa1 and the second auxiliary sub-pixel circuit PCa2 may be located adjacent to each other. For convenience of description, FIG. 5 illustrates that the first auxiliary sub-pixel circuit PCa1 and the second auxiliary sub-pixel circuit PCa2 include a first auxiliary thin-film transistor TFTa1 and a second auxiliary thin-film transistor TFTa2, respectively.

Because the first auxiliary thin-film transistor TFTa1 and the second auxiliary thin-film transistor TFTa2 may have the same structure, hereinafter, the first auxiliary thin-film transistor TFTa1 is described as a reference.

The organic light-emitting diode OLED corresponding to the first auxiliary sub-pixel Pa1 may be connected to the first auxiliary sub-pixel circuit PCa1 through a connection line TWL. An end of the connection line TWL may be connected to the first auxiliary sub-pixel circuit PCa1, and another end may be connected to a first electrode 210 of the organic light-emitting diode OLED, which is a display element. A contact electrode CM may be between the connection line TWL and the first electrode 210, and thus, the connection line TWL and the first electrode 210 may be electrically connected to each other via the contact electrode CM.

In an embodiment, as shown in FIG. 5, the connection line TWL may include a light-transmitting conductive layer TWLa disposed on a first organic insulating layer 117. The light-transmitting conductive layer TWLa may be connected to the first auxiliary sub-pixel circuit PCa1 through a conductive line TWLa-C. In another embodiment, the light-transmitting conductive layer TWLa may not include the conductive line TWLa-C and may be directly connected to the first auxiliary sub-pixel circuit PCa1.

The substrate 100 may be glass or may include a polymer resin such as polyethersulfone, polyarylate, polyetherimide, polyethylene naphthalate, polyethylene terephthalate, polyphenylene sulfide, polyimide, polycarbonate, cellulose triacetate, and/or cellulose acetate propionate. In an embodiment, the substrate 100 may have a multilayer structure including a base layer including the aforementioned polymer resin and a barrier layer (not shown). The substrate 100 including the polymer resin may have flexible, rollable, and bendable properties.

The pixel circuit layer PCL may be disposed on the substrate 100. The pixel circuit layer PCL may include a first auxiliary sub-pixel circuit PCa1, a second auxiliary sub-pixel circuit PCa2, and insulating layers. In an embodiment, the insulating layers may be inorganic insulating layers and may include a buffer layer 111, a first gate insulating layer 112, a second gate insulating layer 113, a first interlayer insulating layer 114, a second interlayer insulating layer 115, and a third interlayer insulating layer 116. In an embodiment, the insulating layers may be organic insulating layers and may include a first organic insulating layer 117, a second organic insulating layer 118, and a third organic insulating layer 119.

The first auxiliary sub-pixel circuit PCa1 may include a first auxiliary thin-film transistor TFTa1 and a storage capacitor Cst. The first auxiliary thin-film transistor TFTa1 may include a first semiconductor layer AS1, a first gate electrode GE1, a first source electrode (not shown), and a first drain electrode DE1. The storage capacitor Cst may include a lower electrode CE1 and an upper electrode CE2. The first auxiliary thin-film transistor TFTa1 may function as a driving thin-film transistor.

The buffer layer 111 may be disposed on the substrate 100. The buffer layer 111 may include an inorganic insulating material, such as silicon nitride ($SiN_x$), silicon oxynitride (SiON), and/or silicon oxide ($SiO_2$), and may include a single layer or multilayer including the aforementioned inorganic insulating material.

The bottom metal layer BML may be located between the substrate 100 and the buffer layer 111. The bottom metal layer BML may be disposed to overlap the first auxiliary sub-pixel circuit PCa1 under the first auxiliary sub-pixel circuit PCa1 to protect the first auxiliary sub-pixel circuit PCa1. The bottom metal layer BML may include a reflective metal, for example, silver (Ag), molybdenum (Mo), aluminum (Al), aluminum nitride (AlN), tungsten (W), tungsten nitride (WN), copper (Cu), titanium (Ti), and/or silicon (Si).

The first semiconductor layer AS1 may include a silicon semiconductor. The first semiconductor layer AS1 may include polysilicon. In other embodiments, the first semiconductor layer AS1 may include amorphous silicon. In some embodiments, the first semiconductor layer AS1 may include an oxide semiconductor, an organic semiconductor, or the like. The first semiconductor layer AS1 may include a channel region, and a drain region and a source region respectively disposed on both sides of the channel region. The first gate electrode GE1 may overlap the channel region.

The first gate electrode GE1 may overlap the first semiconductor layer AS1. The first gate electrode GE1 may include a low-resistance metal material. The first gate electrode GE1 may include a conductive material including Mo, Al, Cu, Ti, and/or the like, and may include a multilayer or single layer including the conductive material.

The first gate insulating layer 112 may be located between the first semiconductor layer AS1 and the first gate electrode GE1. Accordingly, the first semiconductor layer AS1 may be insulated from the first gate electrode GE1. The first gate insulating layer 112 may include an inorganic insulating material, such as $SiO_2$, $SiN_x$, SiON, $Al_2O_3$, $TiO_2$, $Ta_2O_5$, $HfO_2$, and/or ZnO.

The second gate insulating layer 113 may cover the first gate electrode GE1. The second gate insulating layer 113 may be disposed on the first gate electrode GE1. Similar to the first gate insulating layer 112, the second gate insulating layer 113 may include an inorganic insulating material, such as $SiO_2$, $SiN_x$, SiON, $Al_2O_3$, $TiO_2$, $Ta_2O_5$, $HfO_2$, and/or ZnO.

The upper electrode CE2 may be disposed on the second gate insulating layer 113. The upper electrode CE2 may overlap the first gate electrode GE1 thereunder. The upper electrode CE2 and the first gate electrode GE1 may overlap each other with the second gate insulating layer 113 therebetween to form the storage capacitor Cst. In other words, the first gate electrode GE1 of the first auxiliary thin-film transistor TFTa1 may function as the lower electrode CE1 of the storage capacitor Cst.

In this way, the storage capacitor Cst and the first auxiliary thin-film transistor TFTa1 may be formed to overlap each other. In some embodiments, the storage capacitor Cst may be formed not to overlap the first auxiliary thin-film transistor TFTa1.

The upper electrode CE2 may include Al, platinum (Pt), palladium (Pd), Ag, magnesium (Mg), gold (Au), nickel (Ni), neodymium (Nd), iridium (Ir), chromium (Cr), calcium (Ca), Mo, Ti, W, and/or Cu, and may include a single layer or multilayer including the aforementioned material.

The first interlayer insulating layer 114 and the second interlayer insulating layer 115 may cover the upper electrode CE2. In an embodiment, the first interlayer insulating layer 114 and the second interlayer insulating layer 115 may cover the first gate electrode GE1. The first interlayer insulating layer 114 and the second interlayer insulating layer 115 may each include $SiO_2$, $SiN_x$, SiON, $Al_2O_3$, $TiO_2$, $Ta_2O_5$, $HfO_2$, ZnO, and/or the like. The first interlayer insulating layer 114 and the second interlayer insulating layer 115 may each be a single layer or multilayer including the aforementioned inorganic insulating material.

The first source electrode (not shown) and the first drain electrode DE1 may be disposed on the third interlayer insulating layer 116. The first source electrode (not shown) and the first drain electrode DE1 may be connected to the first semiconductor layer AS1. The first source electrode (not shown) and the first drain electrode DE1 may be connected to the first semiconductor layer AS1 through contact holes of the insulating layers.

The first source electrode (not shown) and the first drain electrode DE1 may each include a conductive material including Mo, Al, Cu, Ti, and/or the like, and may include a multilayer or single layer including the conductive material. In an embodiment, the first source electrode (not shown) and the first drain electrode DE1 may each have a multilayer structure of Ti/Al/Ti.

The first organic insulating layer 117 may be located to cover the first source electrode (not shown) and the first drain electrode DE1. A data line DL for delivering a data signal and a driving voltage line (not shown) for delivering a driving voltage may be disposed on the first organic insulating layer 117. The first source electrode (not shown) and the first drain electrode DE1 may be connected to the data line DL or the driving voltage line (not shown) directly or through another thin-film transistor.

A conductive line TWLa-C connected to the first source electrode (not shown) or the first drain electrode DE1 may be disposed on the first organic insulating layer 117, and the contact electrode CM connected to the conductive line TWLa-C through the connection line TWL may also be disposed on the first organic insulating layer 117.

The second organic insulating layer 118 and the third organic insulating layer 119 may be located to cover the conductive line TWLa-C and the contact electrode CM. The first organic insulating layer 117 to the third organic insulating layer 119 may each include an organic insulating material, for example, a general purpose polymer, such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or a blend thereof.

A display element layer EDL may be disposed on the pixel circuit layer PCL. The display element layer EDL may include a display element. In an embodiment, the display element layer EDL may include an organic light-emitting diode OLED as a display element located in the component area CA.

The organic light-emitting diode OLED may be disposed on the third organic insulating layer 119. As a display element, the organic light-emitting diode OLED may be electrically connected to the first auxiliary sub-pixel circuit PCa1 to implement the first auxiliary sub-pixel Pa1. The organic light-emitting diode OLED may include a first electrode 210, an intermediate layer 220 including an organic emission layer, and a second electrode 230 opposite the first electrode 210.

The first electrode 210 may be a pixel electrode. The first electrode 210 may be electrically connected to the contact electrode CM through a contact hole provided on the first organic insulating layer 117. The first electrode 210 may be a reflective electrode. In an embodiment, the first electrode 210 may include a reflective layer including Ag, Mg, Al, Pt, Pd, Au, Ni, Nd, Ir, Cr, or a compound thereof, and a transparent or semi-transparent electrode layer formed on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). For example, the first electrode 210 may have a multilayer structure of ITO/Ag/ITO.

A bank layer 120 may be disposed on the third organic insulating layer 119. The bank layer 120 may increase the distance between the edge of the first electrode 210 and the second electrode 230 above the first electrode 210 to thereby prevent arcs, etc. from occurring at the edge of the first electrode 210.

The bank layer 120 may include one or more organic insulating materials selected from the group consisting of polyimide, polyamide, acrylic resin, benzocyclobutene, and phenol resin, and may be formed by spin coating or the like. The bank layer 120 may be transparent or may include a light blocking material and have a black color.

The intermediate layer 220 of the organic light-emitting diode OLED may be located in an opening 1200P formed by the bank layer 120. An emission area of the organic light-emitting diode OLED may be defined by the opening 1200P of the bank layer 120.

The intermediate layer 220 may include an emission layer 220b. The emission layer 220b may include an organic material including a fluorescent or phosphorescent material emitting red, green, blue, or white light. The emission layer 220b may include a low molecular weight organic material or a high molecular weight organic material, and a first functional layer 220a and a second functional layer 220c may be selectively further located below and above the emission layer 220b. The first functional layer may include a hole transport layer (HTL) and a hole injection layer (HIL), and the second functional layer 220c may include an electron transport layer (ETL) and an electron injection layer (EIL).

The second electrode 230 may be a reflective electrode. In some embodiments, the second electrode 230 may include a metal thin film having a low work function, which includes Li, Ca, LiF/Ca, LiF/Al, Al, Ag, Mg, and/or a compound thereof. A transparent conductive oxide (TCO) layer including ITO, IZO, ZnO, and/or $In_2O_3$ may be further disposed on the metal thin film. The second electrode 230 may be integrally formed over the entire display area DA and located above the intermediate layer 220 and the bank layer 120.

An upper layer 250 including an organic material may be formed on the second electrode 230. The upper layer 250 may protect the second electrode 230 and increase light extraction efficiency. The upper layer 250 may include an organic material having a higher refractive index than that of the second electrode 230. In other embodiments, the upper layer 250 may include a stack of layers having different refractive indices. For example, the upper layer 250 may be provided by stacking a high refractive index layer/low refractive index layer/high refractive index layer. The refractive index of the high refractive index layer may be about 1.7 or more, and the refractive index of the low refractive index layer may be about 1.3 or less.

The upper layer 250 may additionally include lithium fluoride (LiF). In other embodiments, the upper layer 250 may additionally include an inorganic insulating material, such as $SiO_2$ and $SiN_X$.

Figure 6:
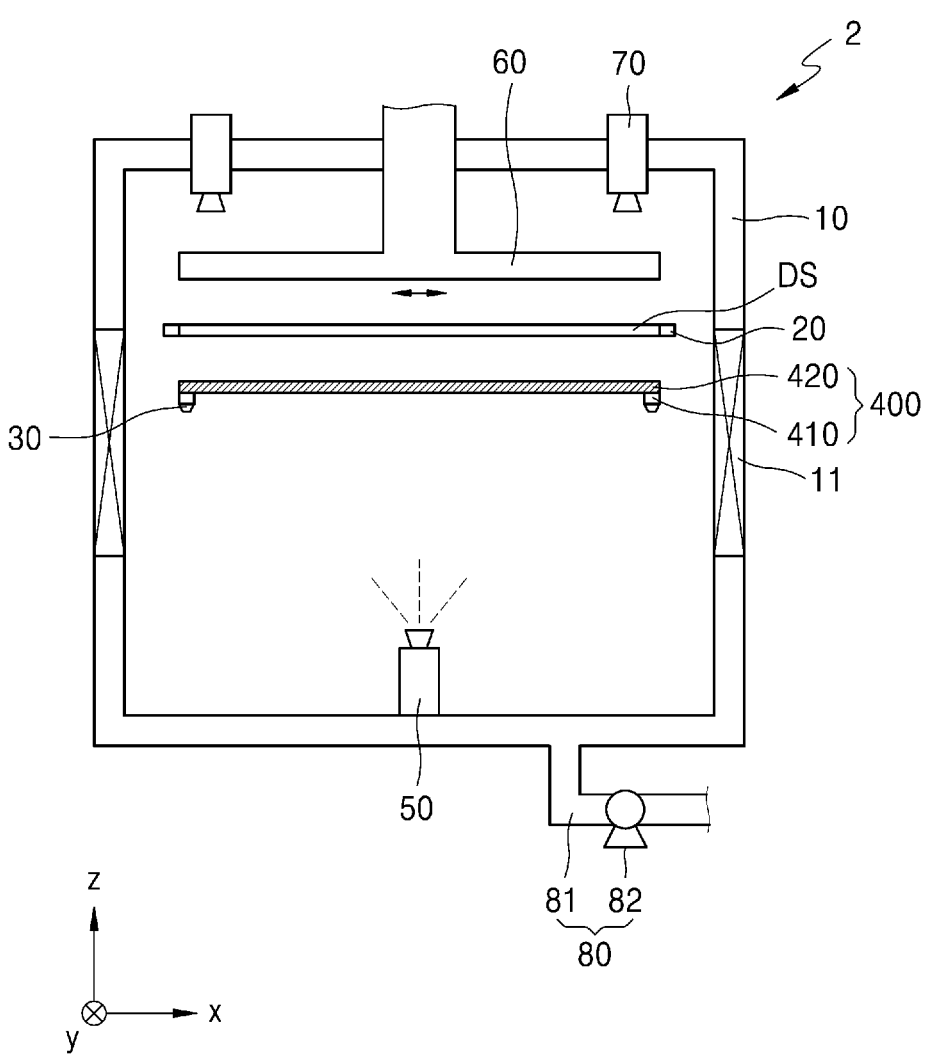
FIG. 6 is a schematic view illustrating an apparatus for manufacturing a display device, according to an embodiment.

FIG. 6 is a schematic view illustrating an apparatus 2 for manufacturing a display device, according to an embodiment. In an embodiment, the apparatus 2 for manufacturing a display device may be used to manufacture the display device described above.

An apparatus 2 for manufacturing a display device may include a chamber 10, a first supporter 20, a second supporter 30, a mask assembly 400, a deposition source 50, a magnetic force portion 60, a vision portion 70, and a pressure controller 80.

The chamber 10 may have a space formed therein, in which a display substrate DS and the mask assembly 400 may be accommodated. In this state, a portion of the chamber 10 may be formed to be open, and a gate valve 11 may be provided in the open portion of the chamber 10. The open portion of the chamber 10 may be open or closed depending on the operation of the gate valve 11.

In this state, the display substrate DS may refer to a display substrate DS in a process of manufacturing a display device, in which at least one of an organic layer, an inorganic layer, and a metal layer is deposited on a substrate 100 described above. In other embodiments, the display substrate DS may be the substrate 100 on which any of the organic layer, the inorganic layer, and the metal layer is not deposited.

The first supporter 20 may support the display substrate DS. In this state, the first supporter 20 may have a shape of a plate fixed in the chamber 10. In another embodiment, the first supporter 20 may be where the display substrate DS is placed, and may be provided in the form of a shuttle capable of linear motion inside the chamber 10. In another embodiment, the first supporter 20 may include an electrostatic chuck or an adhesive chuck that is fixed to the chamber 10 or located in the chamber 10 to be movable in the chamber 10.

The second supporter 30 may support the mask assembly 400. In this state, the second supporter 30 may be located in the chamber 10. The second supporter 30 may be capable of fine adjustment of the position of the mask assembly 400. In this state, the second supporter 30 may include a separate driving portion, an alignment unit, and the like to move the mask assembly 400 in different directions.

In another embodiment, the second supporter 30 may be provided in the form of a shuttle. The second supporter 30 is where the mask assembly 400 is placed, and may transfer the mask assembly 400. For example, the second supporter 30 may move to the outside of the chamber 10 and may enter the chamber 10 from the outside after the mask assembly 400 is placed thereon.

In the above case, the first supporter 20 and the second supporter 30 may be integrally formed. The first supporter 20 and the second supporter 30 may each include a movable shuttle. In this state, the first supporter 20 and the second supporter 30 may include structures to fix the mask assembly 400 and the display substrate DS, the display substrate DS being placed on the mask assembly 400, and are capable of linearly moving the display substrate DS and the mask assembly 400 at the same time.

However, hereinafter, for convenience of description, the case where the first supporter 20 and the second supporter 30 are separately formed at different positions in the chamber 10 is described in detail.

The deposition source 50 may be located to face the mask assembly 400. In this state, the deposition source 50 may include a deposition material, and by applying heat to the deposition material, the deposition material may evaporate or sublimate. The deposition source 50 may be located to be fixed in the chamber 10 or to be capable of linear motion in a direction in the chamber 10.

The mask assembly 400 may be located in the chamber 10. In this state, the mask assembly 400 may include a mask frame 410 and a mask sheet 420, which is described below in detail. The deposition material may be deposited on the display substrate DS by passing through the mask assembly 400.

The magnetic force portion 60 may be located in the chamber 10 to face the display substrate DS and/or the mask assembly 400. In this state, the magnetic force portion 60 may apply a force to the mask assembly 400 toward the display substrate DS by applying a magnetic force to the mask assembly 400. In particular, the magnetic force portion 60 may not only prevent sagging of the mask sheet 420, but also make the mask sheet 420 be adjacent to the display substrate DS. Furthermore, the magnetic force portion 60 may maintain a uniform distance between the mask sheet 420 and the display substrate DS.

The vision portion 70 may be located in the chamber 10, and may capture images of the positions of the display substrate DS and the mask assembly 400. In this state, the vision portion 70 may include a camera for capturing images of the display substrate DS and the mask assembly 400. The positions of the display substrate DS and the mask assembly 400 may be identified based on the images captured by the vision portion 70, and thus, deformation of the mask assembly 400 may be checked. Furthermore, based on the images, the first supporter 20 may finely adjust the position of the display substrate DS or the second supporter 30 may finely adjust the position of the mask assembly 400. However, hereinafter, the case where the positions of the display substrate DS and the mask assembly 400 are aligned with each other by finely adjusting the position of the mask assembly 400 by using the second supporter 30 is described in detail.

The pressure controller 80 may be connected to the chamber 10 and may control the pressure in the chamber 10. For example, the pressure controller 80 may control the pressure in the chamber 10 to be the same as or similar to atmospheric pressure. Furthermore, the pressure controller 80 may control the pressure in the chamber 10 to be the same as or similar to a vacuum state.

The pressure controller 80 may include a connection pipe 81 connected to the chamber 10 and a pump 82 provided on the connection pipe 81. In this state, depending on the operation of the pump 82, external air may be introduced into the chamber 10 through the connection pipe 81 or the gas inside the chamber 10 may be guided to the outside through the connection pipe 81.

In a method of manufacturing a display device (not shown) by using the apparatus 2 for manufacturing a display device described above, first, the display substrate DS may be prepared.

The pressure controller 80 may maintain the inside of the chamber 10 to be the same as or similar to atmospheric pressure, and as the gate valve 11 is operated, the open portion of the chamber 10 may be open.

The display substrate DS may be loaded from the outside of the chamber 10 into the inside thereof. In this state, the display substrate DS may be loaded into the chamber 10 by various methods. For example, the display substrate DS may be loaded from the outside of the chamber 10 into the inside of the chamber 10 by a robot arm and the like located outside the chamber 10. In another embodiment, in case that the first supporter 20 is formed in the form of a shuttle, it is possible that the first supporter 20 is carried out from the inside of the chamber 10 to the outside of the chamber 10, the display substrate DS is placed on the first supporter 20 by another robot arm and the like located outside the chamber 10, and the first supporter 20 is loaded from the outside of the chamber 10 into the chamber 10.

The mask assembly 400 may be located in the chamber 10 as described above. In another embodiment, it is possible that the mask assembly 400 is loaded from the outside of the chamber 10 into the chamber 10 in a manner that is the same as or similar to the display substrate DS.

In case that the display substrate DS is loaded into the chamber 10, the display substrate DS may be placed on the first supporter 20. In this state, the vision portion may capture images of the positions of the display substrate DS and the mask assembly 400. The positions of the display substrate DS and the mask assembly 400 may be identified based on the images captured by the vision portion 70. In this state, the apparatus 2 for manufacturing a display device may include a separate controller (not shown) to identify the positions of the display substrate DS and the mask assembly 400.

In case that the identification of the positions of the display substrate DS and the mask assembly 400 is complete, the second supporter 30 may finely adjust the position of the mask assembly 400.

As the deposition source 50 is operated, the deposition material may be supplied toward the mask assembly 400, and the deposition material having passed through multiple pattern holes of the mask sheet 420 may be deposited on the display substrate DS. In this state, the deposition source 50 may move parallel to the display substrate DS and the mask assembly 400, or the display substrate DS and the mask assembly 400 may move parallel to the deposition source 50. In other words, the deposition source 50 may move relative to the display substrate DS and the mask assembly 400. In this state, the pump 82 may suck the gas in the chamber 10 and discharge the gas to the outside so that the pressure in the chamber 10 may be maintained to be the same as or similar to a vacuum state.

As described above, the deposition material supplied from the deposition source 50 may pass through the mask assembly 400 to be deposited on the display substrate DS, and thus, at least one of multiple layers, for example, an organic layer, an inorganic layer, and a metal layer, to be stacked on each other on the display device described above may be formed.

Figure 7:
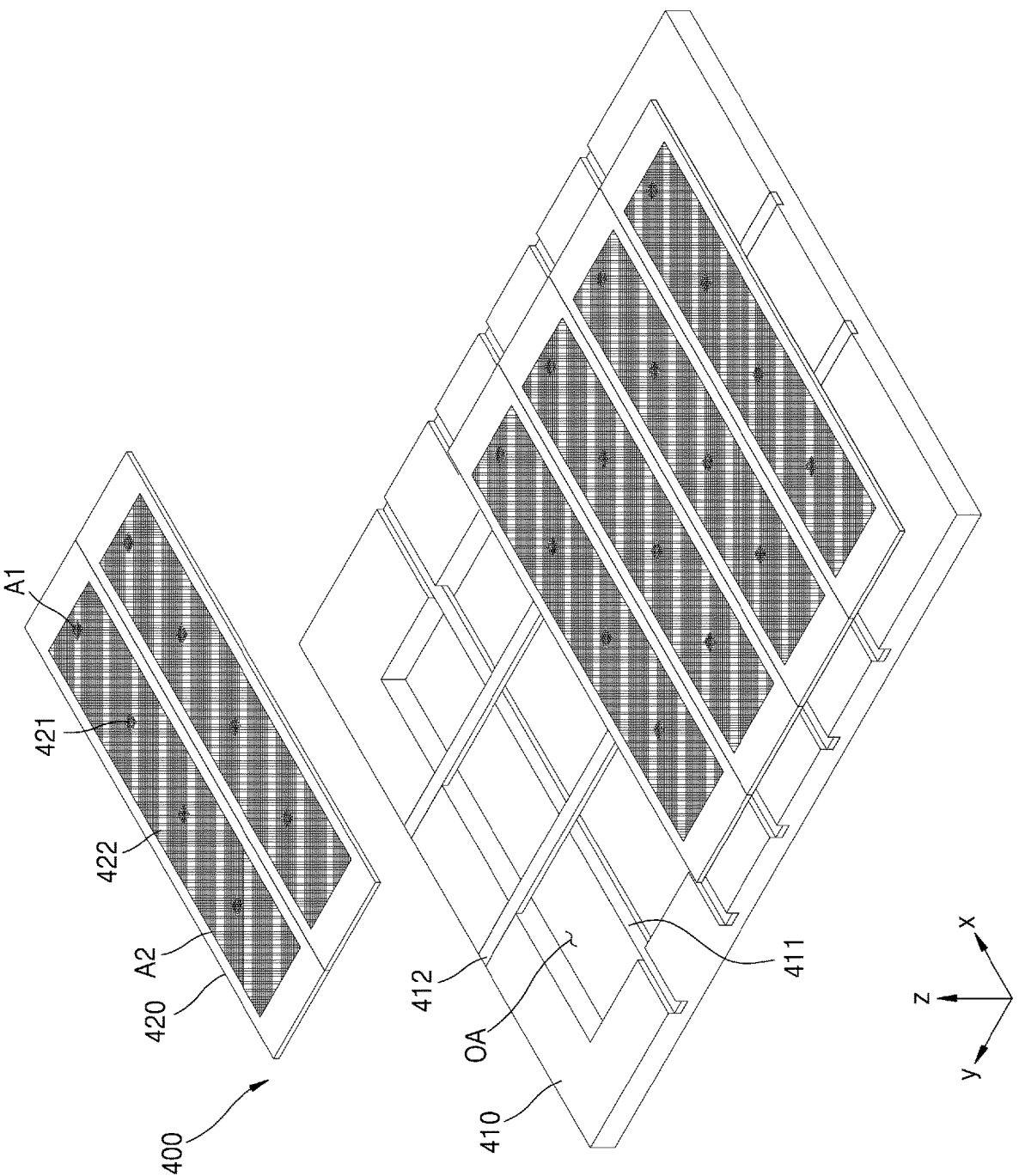
FIG. 7 is a schematic perspective view illustrating a mask assembly according to an embodiment.

FIG. 7 is a schematic perspective view illustrating a mask assembly according to an embodiment, and shows a mask assembly which may be used in the apparatus for manufacturing a display apparatus.

Referring to FIG. 7, the mask assembly 400 may include the mask frame 410 and the mask sheet 420.

The mask frame 410 may be formed by connecting multiple sides, and may include an opening area OA defined by the sides. In other words, the opening area OA may be surrounded by the sides, and the opening area OA may penetrate the center of the mask frame 410.

In this state, a shielding stick 411 extending in a first direction, for example, an x direction as in FIG. 7, may be located across the inside of the mask frame 410, that is, the opening area OA. Grooves for accommodating both end portions of the shielding stick 411 may be located in the mask frame 410. The shielding stick 411 may be located in the grooves of the mask frame 410 and located between multiple mask frames 410 to shield a deposition material from passing between two adjacent mask frames 410. Multiple shielding sticks 411 may be provided which may be spaced apart from each other in a second direction, for example, a y direction as in FIG. 7, and located parallel to each other.

A support stick 412 extending in the second direction, for example, the y direction as in FIG. 7, may be located across the inside of the mask frame 410, that is, the opening area OA. The support stick 412 may cross or intersect the shielding stick 411 in the opening area OA, and may be disposed on the shielding stick 411. Grooves for accommodating both end portions of the support stick 412 may be located in the mask frame 410. The support stick 412 may prevent sagging of the mask sheet 420 by supporting the mask sheet 420 in the opening area OA.

The mask frame 410 may be a rectangular frame in an embodiment. However, the shape of the mask frame 410 is not limited thereto, and may be various types of polygonal shapes. Hereinafter, for convenience of description, the case where the mask frame 410 is a quadrangular frame is described.

The mask sheet 420 may be disposed on the mask frame 410. The opening area OA at the center of the mask frame 410 may be covered by the mask sheet 420. In an embodiment, the mask sheet 420 may include at least one mask sheet, and in case that the mask sheet 420 includes at least two mask sheets, the mask sheets 420 may be disposed on the mask frame 410 to be parallel to each other. For example, the mask sheets 420 may be arranged in parallel in the second direction (for example, the y direction of FIG. 2). In this state, each of the mask sheets 420 may have a shape extending long in the first direction (for example, the x direction of FIG. 2). Both end portions of each of the mask sheets 420 may be fixed to the mask frame 410 by a method, for example, welding.

Figure 8:
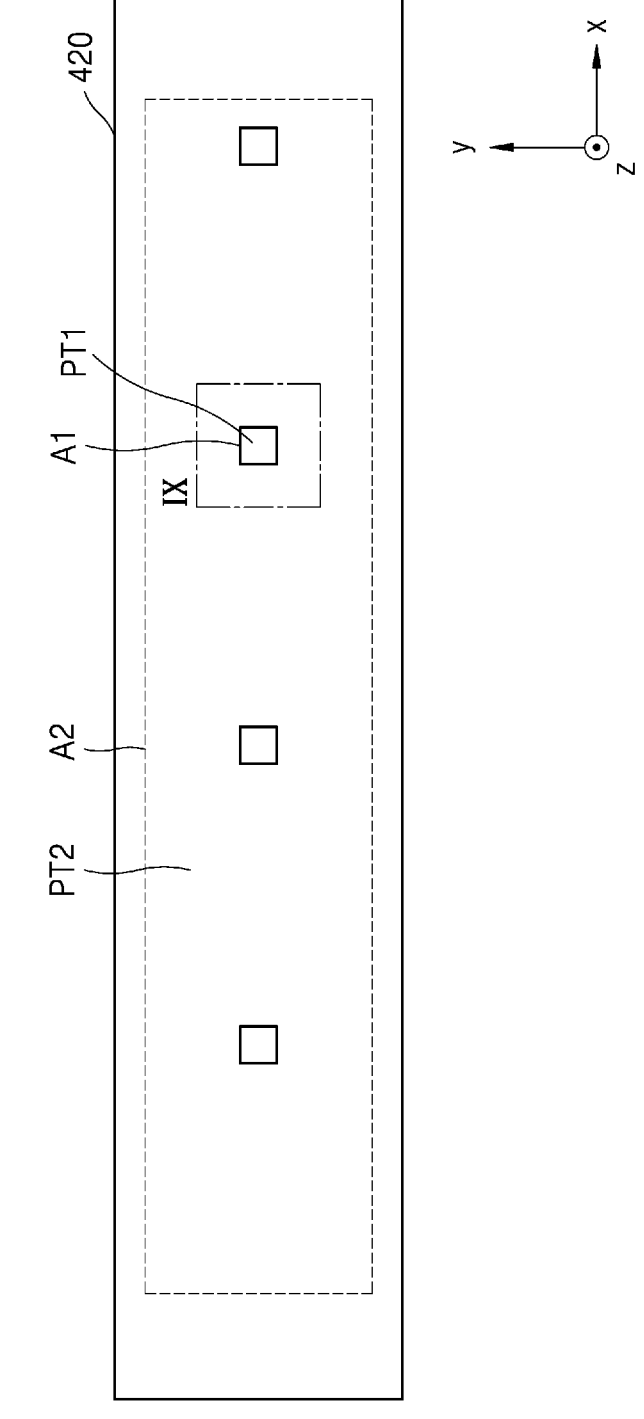
FIG. 8 is a schematic plan view illustrating a mask sheet according to an embodiment.

FIG. 8 is a plan view illustrating a mask sheet 420 according to an embodiment.

Referring to FIG. 8, the mask sheet 420 may include a first area A1 and a second area A2 located to surround the first area A1. In an embodiment, the mask sheet 420 may allow a deposition material to pass therethrough for multiple display devices. In other words, a deposition material may be simultaneously deposited on multiple cells through one mask sheet 420. The first area A1 may be an area corresponding to the auxiliary display area ADA (see FIG. 1) of the display device described above. For example, in case that the mask sheet 420 is located adjacent to the display substrate DS (see FIG. 6), an area of the display substrate DS corresponding to the first area A1 may be the auxiliary display area ADA. Also, the second area A2 may be an area corresponding to the main display area MDA (see FIG. 1) of the display device described above. For example, in case that the mask sheet 420 is located adjacent to the display substrate DS (see FIG. 6), an area of the display substrate DS corresponding to the second area A2 may be the main display area MDA.

As shown in FIG. 8, the first area A1 may have a quadrangular shape in a plan view, but is not limited thereto, and it will be understood that the first area A1 may have a circular shape or an oval shape. Hereinafter, for convenience of description, the case where the first area A1 has a quadrangular shape is described.

Figure 9:
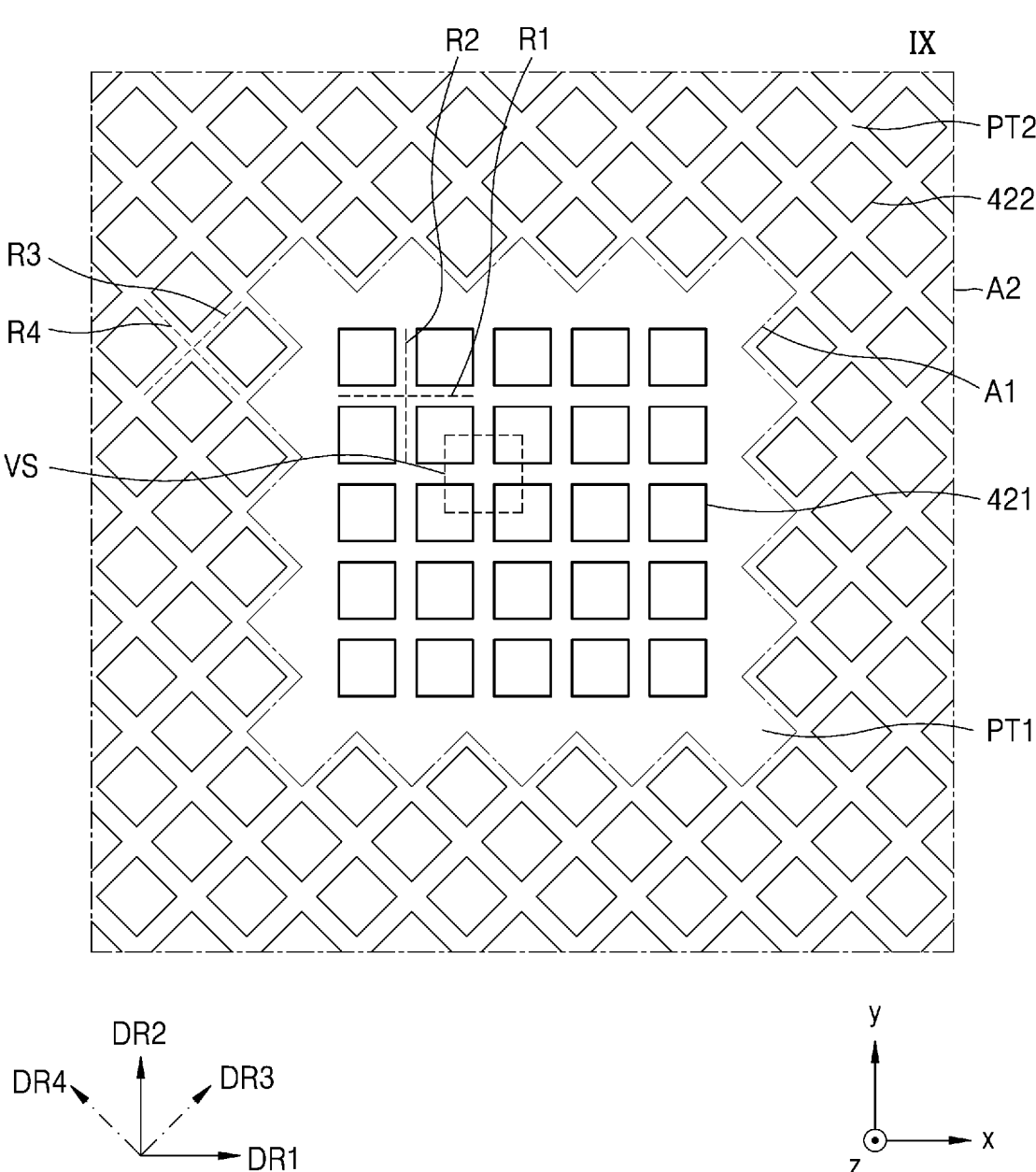
FIG. 9 is a schematic plan view illustrating a mask sheet according to an embodiment, and is an enlarged view of region IX of FIG. 8.

FIG. 9 is a schematic plan view illustrating a mask sheet 420 according to an embodiment, and is an enlarged view of region IX of FIG. 8.

Referring to FIG. 9, the mask sheet 420 may include opening patterns. Specifically, the mask sheet 420 may include a first opening pattern PT1 located in the first area A1 and a second opening pattern PT2 located in the second area A2. The opening patterns may allow a pattern to be formed, the pattern being formed in case that a deposition material passes through the mask sheet 420 and is deposited on the display substrate DS. For example, the opening patterns of the mask sheet 420 may correspond to the pattern formed on the display substrate DS.

In an embodiment, the first opening pattern PT1 may be a half-etched pattern. In other words, the first opening pattern PT1 may be a pattern formed by partial etching in a thickness direction (e.g., the z direction of FIG. 9) thereof. Accordingly, the first opening pattern PT1 may be a non-penetrating pattern rather than a penetrating pattern.

Although the deposition material may not pass through the first opening pattern PT1, the first opening pattern PT1 may be formed by half-etching for the deposition quality of the mask sheet 420. Specifically, in case that the first area A1 is not half-etched, the difference between the average thickness of the first area A1 and the average thickness of the second area A2 in which the second opening pattern PT2, which is a penetrating pattern, is located may be relatively great. In other words, in case that the first area A1 is half-etched, the difference between the average thickness of the first area A1 and the average thickness of the second area A2 may be reduced. This may reduce a difference in the influence of a magnetic force by the magnetic force portion 60 described above, and thus, the mask sheet 420 may be uniformly maintained. Here, the average thickness may refer to a thickness obtained by dividing the volume of a specific region by the area of the specific region. For example, the average thickness of the first area A1 may refer to a thickness obtained by dividing the volume of the mask sheet 420 in the first area A1 by the area of the first area A1. Similarly, the average thickness of the second area A2 may refer to a thickness obtained by dividing the volume of the mask sheet 420 in the second area A2 by the area of the second area A2.

In the first area A1, the first opening pattern PT1 may include a first rib R1 extending in a first direction DR1 (e.g., an x direction in FIG. 9), and a second rib R2 extending in a second direction DR2 (e.g., a y direction in FIG. 9) intersecting with the first direction DR1. In an embodiment, the first direction DR1 in which the first rib R1 extends may be perpendicular to the second direction DR2 in which the second rib R2 extends. Multiple first ribs R1 may be provided to be apart from each other in the second direction DR2 and may be arranged in parallel. Multiple second ribs R2 may be provided to be apart from each other in the first direction DR1 and may be arranged in parallel. Accordingly, multiple half openings 421 may be defined by the first ribs R1 and the second ribs R2.

Each of the half openings 421 may be a non-penetrating opening that is half-etched and partially etched in a thickness direction thereof. In an embodiment, each of the half openings 421 may have a quadrangular shape due to the first rib R1 extending in the first direction DR1 and the second rib R2 extending in the second direction DR2. For convenience of description, it is illustrated in FIG. 9 that the half openings 421 are arranged in 5 rows and 5 columns in the first area A1. However, the disclosure is not limited thereto, and it will be understood that a greater number of half openings 421 may be arranged according to the size of the first area A1.

In an embodiment, the second opening pattern PT2 may be a penetrating pattern. In other words, the second opening pattern PT2 may be a pattern formed by etching to completely penetrate in the thickness direction (e.g., the z direction of FIG. 9) thereof.

In the second area A2, the second opening pattern PT2 may include a third rib R3 extending in a third direction DR3, and a fourth rib R4 extending in a fourth direction DR4 intersecting with the third direction DR3. In an embodiment, the third direction DR3 in which the third rib R3 extends may be perpendicular to the fourth direction DR4 in which the fourth rib R4 extends. Multiple third ribs R3 may be provided to be apart from each other in the fourth direction DR4 and may be arranged in parallel. Multiple fourth ribs R4 may be provided to be apart from each other in the third direction DR3 and may be arranged in parallel. Accordingly, multiple openings 422 may be defined by the third ribs R3 and the fourth ribs R4.

Each of the openings 422 may be a penetrating opening completely etched in a thickness direction thereof. In an embodiment, each of the openings 422 may have a quadrangular shape due to the third rib R3 extending in the third direction DR3 and the fourth rib R4 extending in the fourth direction DR4. In other embodiments, the opening 422 may be formed in various shapes within an imaginary quadrangle defined by the third rib R3 and the fourth rib R4. Hereinafter, for convenience of description, the case where the opening 422 is quadrangular is described.

In an embodiment, the first direction DR1 that is the extension direction of the first rib R1 may intersect with the third direction DR3 that is the extension direction of the third rib R3. The second direction DR2 that is the extension direction of the second rib R2 may also intersect with the third direction DR3 that is the extension direction of the third rib R3. For example, the third direction DR3 may be a direction between the first direction DR1 and the second direction DR2. In an embodiment, an angle between the third direction DR3 and the first direction DR1 may be 45°. Also, an angle between the second direction DR2 and the third direction DR3 may be 45°.

Similarly, the first direction DR1 that is the extension direction of the first rib R1 may intersect with the fourth direction DR4 that is the extension direction of the fourth rib R4, and the second direction DR2 that is the extension direction of the second rib R2 may also intersect with the fourth direction DR4 that is the extension direction of the fourth rib R4. As shown in FIG. 9, the second direction DR2 may be a direction between the third direction DR3 and the fourth direction DR4. In an embodiment, an angle between the fourth direction DR4 and the second direction DR2 may be 45°. Also, an angle between the fourth direction DR4 and the first direction DR1 may be 135°.

As such, the extending directions of the first and second ribs R1 and R2 in the first area A1 may not coincide with and may intersect with the extending directions of the third and fourth ribs R3 and R4 in the second area A2. Specifically, as shown on the lower left of FIG. 9, in case that the first direction DR1 and the second direction DR2, which respectively are the extending directions of the first rib R1 and the second rib R2, are rotated counterclockwise in the first area A1, the rotated first direction and the rotated second direction may coincide with the third direction DR3 and the fourth direction DR4, which respectively are the extending directions of the third rib R3 and the fourth rib R4.

In an embodiment, the half openings 421 may be aligned in the first direction DR1 and the second direction DR2. In other words, the half openings 421 may be aligned to be apart from each other in the extending directions of the first rib R1 and the second rib R2. Here, the alignment of the half openings 421 in the first direction DR1 and the second direction DR2 may mean that directions of the sides of a virtual quadrangle VS formed in case that the centers of four adjacent half openings 421 are connected to each other are the first direction DR1 and the second direction DR2. Accordingly, from among distances between the centers of any two half openings 421 among the half openings 421, the distance between the centers of two half openings 421 adjacent to each other in at least one of the first direction DR1 and the second direction DR2 may be the shortest distance. For example, in case that the virtual quadrangle VS is a square as shown in FIG. 9, the shortest distance among distances between the centers of any two half openings 421 among the half openings 421 (may be the distance between the centers of two half openings 421 adjacent to each other in the first direction DR1 and the distance between the centers of two half openings 421 adjacent to each other in the second direction DR2.

The multiple openings 422 may be aligned in the third direction DR3 and the fourth direction DR4. In other words, the openings 422 may be aligned to be apart from each other in the extending directions of the third rib R3 and the fourth rib R4. Accordingly, from among distances between the centers of any two openings 422 among the openings 422, the distance between the centers of two openings 422 adjacent to each other in at least one of the third direction DR3 and the fourth direction DR4 may be the shortest distance.

As described above, because the third direction DR3 may be a direction between the first direction DR1 and the second direction DR2, an alignment direction of the openings 422 may be different from an alignment direction of the half openings 421.

In an embodiment, the shape of each of the half openings 421 may be substantially the same as the shape of each of the openings 422 in a plan view. Also, the size of the half opening 421 may be substantially the same as the size of the opening 422 in a plan view. In other words, the first opening pattern PT1 including the half opening 421 and the second opening pattern PT2 including the opening 422 may be substantially identical patterns that differ only in alignment directions.

Figure 10:
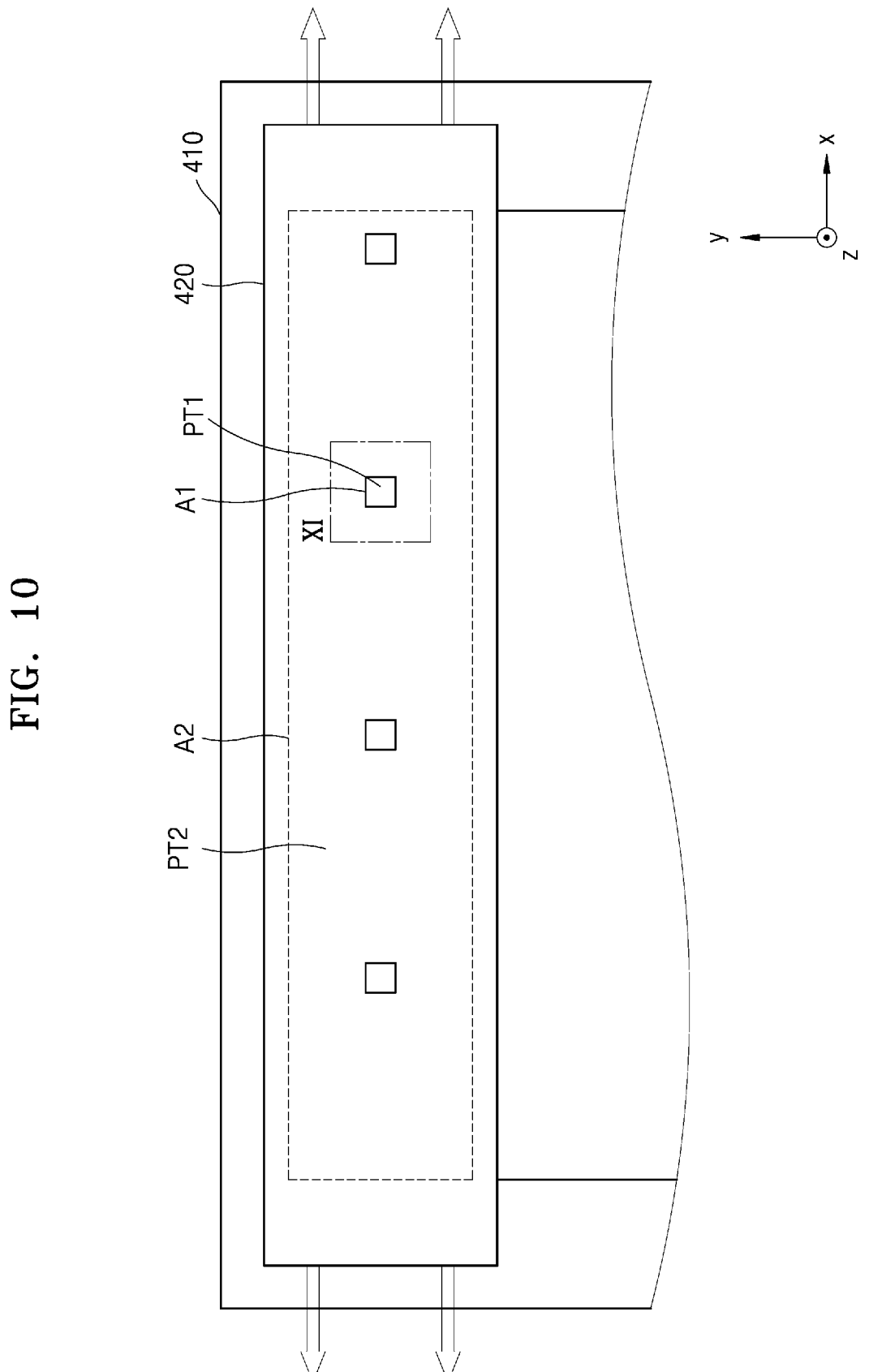
FIG. 10 is a schematic view illustrating a method of manufacturing a mask assembly, according to an embodiment.
Figure 11:
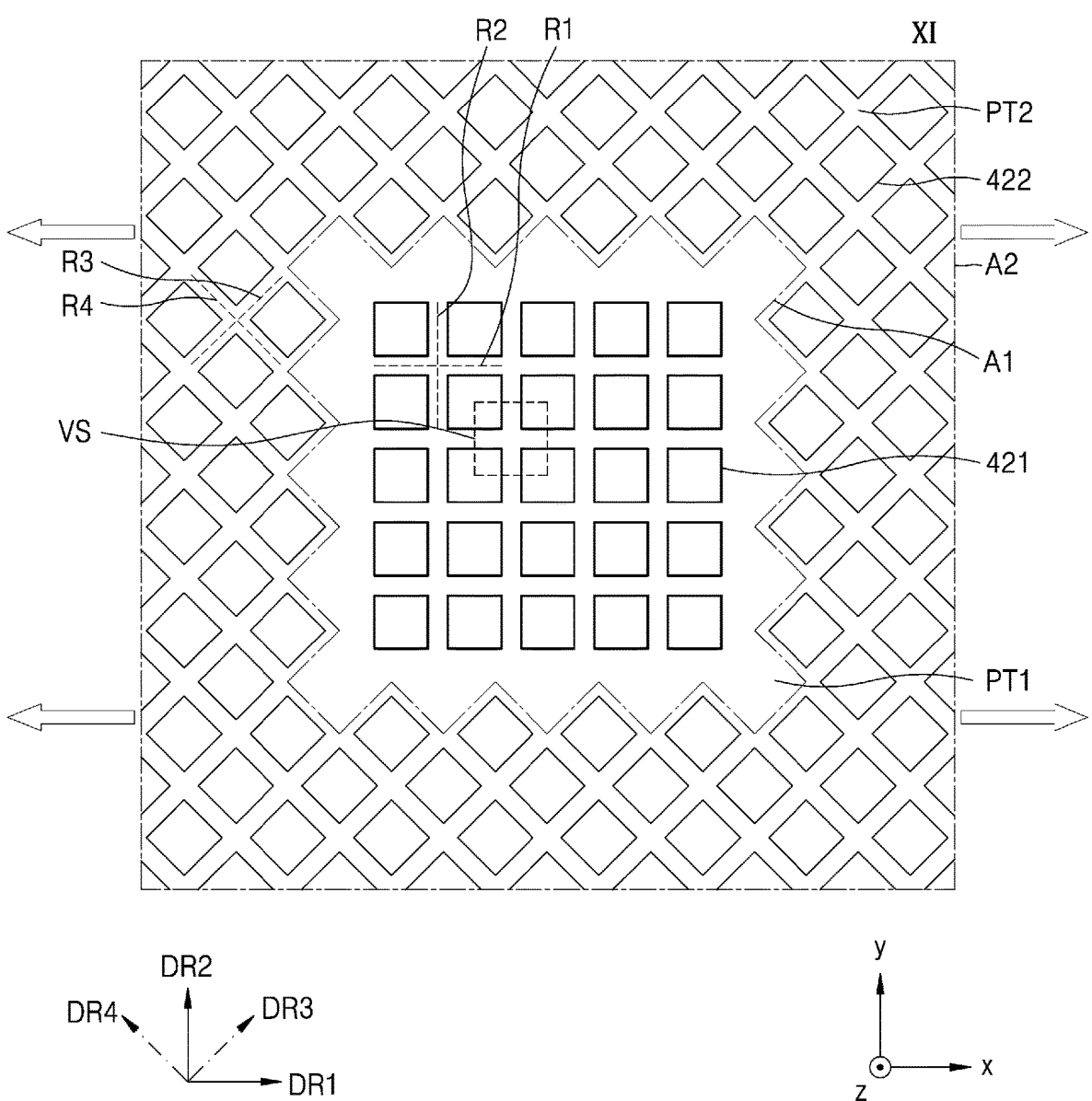
FIG. 11 is an enlarged schematic view of region XI of FIG. 10.
Figure 12:
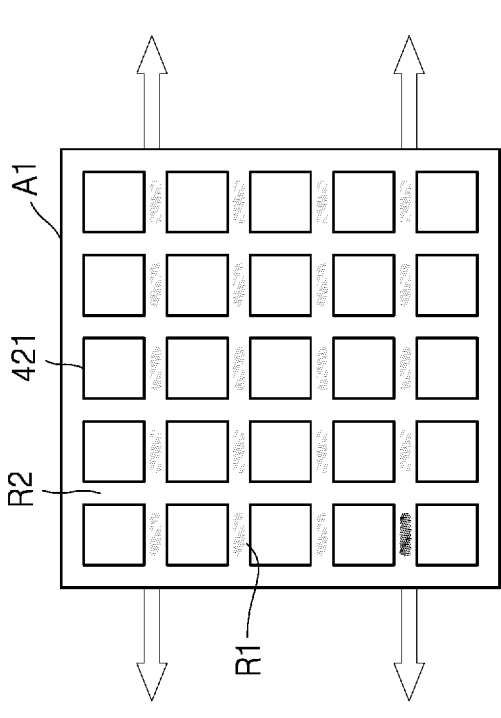
FIG. 12 is a schematic view for comparison with a method of manufacturing a mask assembly, according to an embodiment.
Figure 12:
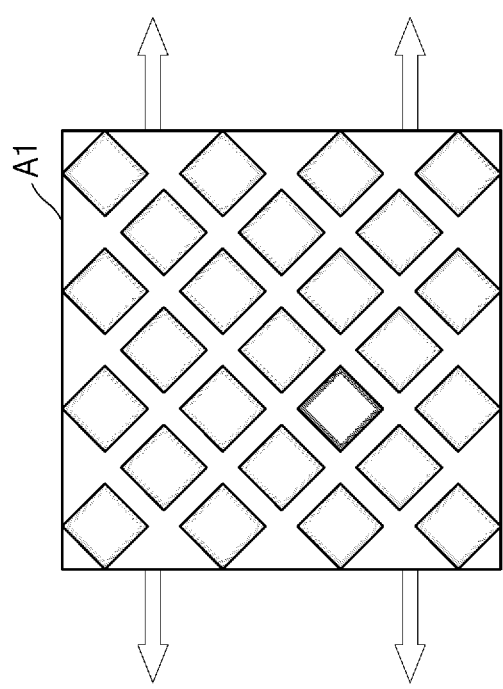

FIG. 10 is a schematic view illustrating a method of manufacturing a mask assembly, according to an embodiment. FIG. 11 is an enlarged schematic view of region XI of FIG. 10. FIG. 12 is a schematic view for comparison with the method of manufacturing a mask assembly, according to an embodiment.

Referring to FIGS. 10 and 11, the mask sheet 420 of FIGS. 7 to 9 described above may be prepared. The mask sheet 420 may be stretched, that is, tensioned, in a longitudinal direction thereof, that is, in a first direction DR1.

In an embodiment, a tensile direction of the mask sheet 420 may be the same as the extending direction of the first rib R1 located in the first area A1. Also, the tensile direction of the mask sheet 420 may be perpendicular to the extending direction of the second rib R2 located in the first area A1. In other words, the tensile direction of the mask sheet 420 may be the same as the alignment direction of the multiple half openings 421.

In an embodiment, the tensile direction of the mask sheet 420 may intersect with the extending direction of the third rib R3 located in the second area A2. Also, the tensile direction of the mask sheet 420 may intersect with the extending direction of the fourth rib R4 located in the second area A2. For example, an angle between the tensile direction of the mask sheet 420 and the extending direction of the third rib R3 may be 45°. The extending direction of the fourth rib R4 may be perpendicular to the extending direction of the third rib R3. In other words, the tensile direction of the mask sheet 420 may intersect with the alignment direction of the multiple openings 422, and an angle between the tensile direction and the alignment direction may be, for example, 45°.

As such, in case that the tensile direction of the mask sheet 420 is the same as the extending direction of the first rib R1, stress concentration generated in the half opening 421 of the first opening pattern PT1 due to the tension of the mask sheet 420 may be relieved.

Specifically, referring to FIG. 12, as shown in the left drawing thereof, in case that the first area A1, that is, a half-etched area, includes ribs extending in a direction intersecting with the tensile direction of the mask sheet 420 (particularly in a direction intersecting with the tensile direction of the mask sheet 420 at an angle of greater than 0° and less than 90°) in the same manner as the second area A2, that is, a fully-etched area, stress may be concentrated along the perimeter of the half opening 421. This may weaken the half opening 421, particularly the perimeter of the half opening 421, and thus, a dent, in which the half opening 421 rises in case that the mask sheet 420 is cleaned, and/or a dent, in which the entire region in which a plurality of half openings 421 are arranged rises, may occur. The occurrence of dents may cause defects in the mask sheet 420.

According to an embodiment, as shown in the right drawing of FIG. 12, in case that the first area A1, that is, the half-etched area, includes ribs extending in the same direction as the tensile direction of the mask sheet 420 and in a direction intersecting with the tensile direction of the mask sheet 420 at an angle of 90°, unlike the second area A2, that is, the fully-etched area, stress may be concentrated on the ribs, in particular, the first ribs R1, instead of the half opening portion 421. Because the first rib R1 is relatively thicker and stronger than the half opening 421, a dent may not occur. Accordingly, defects of the mask sheet 420 may be prevented and the deposition quality of the deposition material may be improved.

Because stress is concentrated on the first rib R1, which is relatively strong, rather than the half opening 421, which is relatively weak, the mask sheet 420 may be formed to be relatively thin as a whole. In other words, there may be a limitation in forming the mask sheet 420 thin due to concerns about the occurrence of a dent in the half opening 421. According to an embodiment, stress is not concentrated on the half opening 421 and the stress is concentrated on the first rib R1, which is relatively strong in stress, and thus, the mask sheet 420 may be formed to be thinner. This may reduce a shadow phenomenon due to the thickness of the mask sheet 420 during deposition of the deposition material and improve the quality of the display device.

Referring back to FIG. 10, the mask sheet 420 that is stretched, that is, tensioned, may be located to be fixed onto a mask frame. In an embodiment, the mask sheet 420 may be fixed onto the mask frame by way of spot welding. Although only one mask sheet 420 is illustrated in FIG. 10, according to the method of manufacturing a mask assembly according to an embodiment, a mask sheet 420 may be tensioned and welded, and then other mask sheets 420 may be tensioned and welded in turn. In other embodiments, all of the mask sheets 420 may be simultaneously tensioned and welded.

Figure 13:
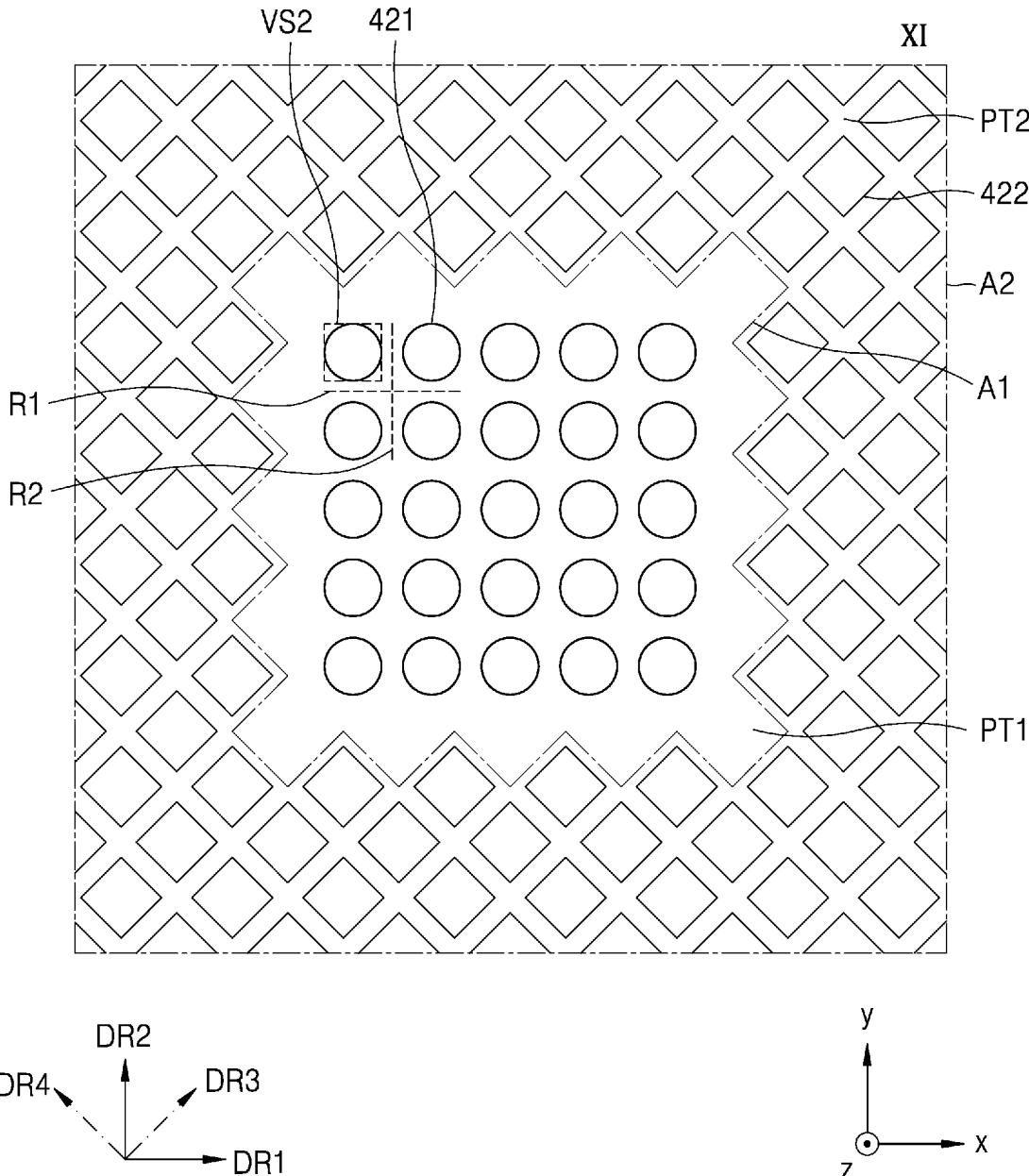
FIGS. 13 and 14 are schematic plan views illustrating a mask sheet according to various embodiments.
Figure 14:
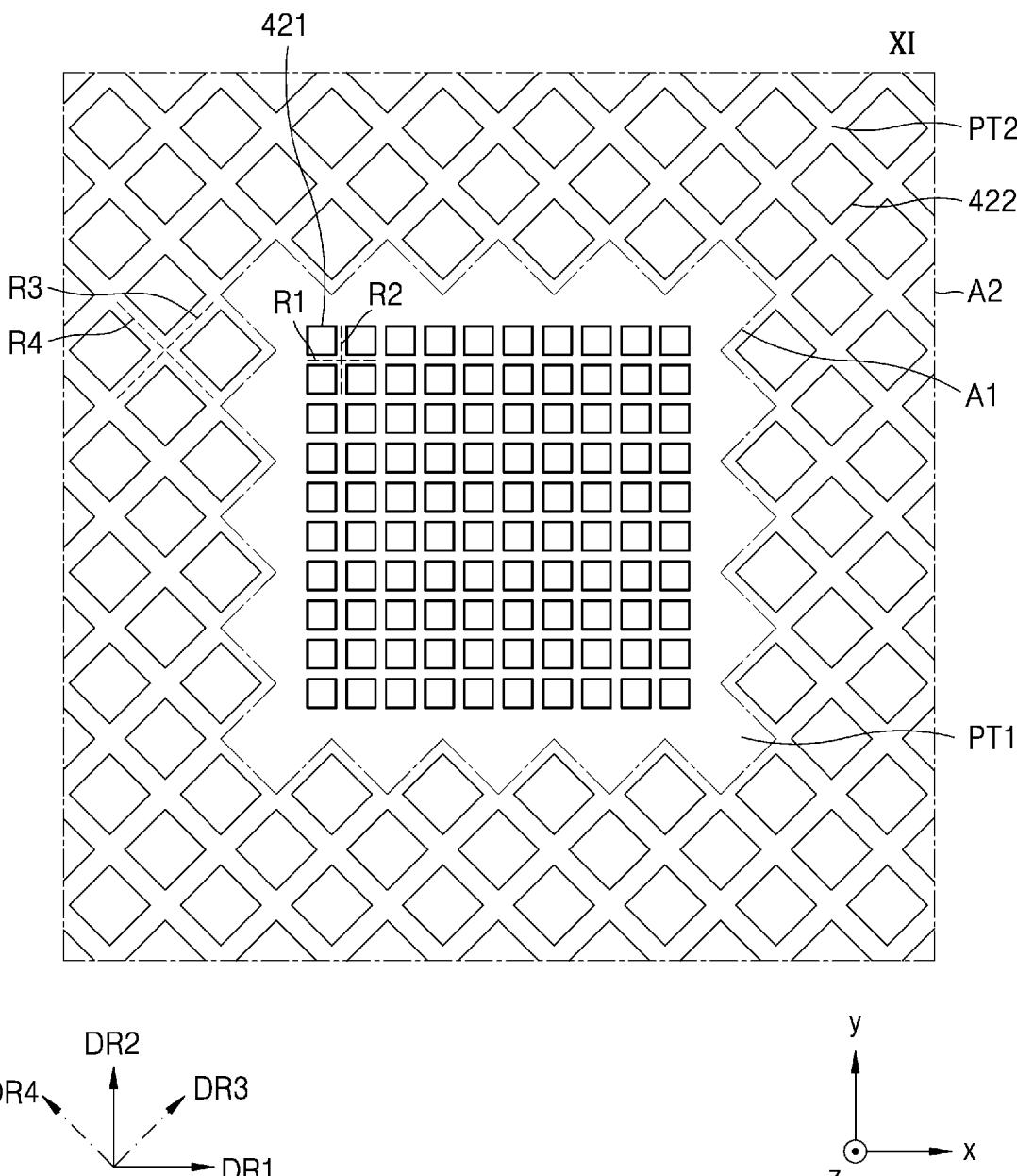

FIGS. 13 and 14 are schematic plan views illustrating a mask sheet according to various embodiments. Because the mask sheet according to the embodiments is similar to the mask sheet described above, hereinafter, differences will be described for convenience of description.

Referring to FIG. 13, in an embodiment, the shape of a half opening 421 may be different from the shape of an opening 422 in a plan view. The half opening 421 may be formed to have various shapes within a virtual quadrangle VS2 defined by a first rib R1 and a second rib R2 shown in FIG. 13. For example, the shape of the half opening 421 may be circular as shown in FIG. 13. As compared with the case where the perimeter of the half opening 421 is angled, stress concentration may be distributed around the half opening 421 and a dent in the half opening 421 may be prevented.

Referring to FIG. 14, in an embodiment, the size of the half opening 421 may be different from the size of the opening 422. For example, the size of the half opening 421 may be less than the size of the opening 422, or may be greater than the size of the opening 422. Hereinafter, the case where the size of the half opening 421 is less than the size of the opening 422 is described. The shape of the half opening 421 may be substantially the same as the shape of the opening 422. For example, as shown in FIG. 14, the shape of the half opening 421 and the shape of the opening 422 may be quadrangles having the same ratio of sides.

In case that the size of the half opening 421 is less than the size of the opening 422, a relatively large number of half openings 421 may be arranged. In other words, the number of half openings 421 located per unit area in a plan view may be greater than the number of openings 422 located per unit area. Furthermore, because the half opening 421 is defined by the first rib R1 and the second rib R2 and the opening 422 is defined by the third rib R3 and the fourth rib R4, the numbers of first ribs R1 and second ribs R2 arranged per unit area in a plan view may be greater than the numbers of third ribs R3 and fourth ribs R4 arranged per unit area in the plan view. For example, in the case of FIG. 14, the number of first ribs R1 per unit area may be about twice the number of third ribs R3 per unit area. The number of second ribs R2 per unit area may be about twice the number of third ribs R3 per unit area.

Also, although not shown in the drawings, the size of the half opening 421 may be less than the size of the opening 422 as in FIG. 14 and the shape of the half opening 421 may be different from the shape of the opening 422. For example, the half opening 421 may be formed to have a circular shape and the opening 422 may be formed to have a quadrangular shape.

Even in the above cases, as described above, because an extending direction of the first rib R1 is the same as a tensile direction of the mask sheet 420, stress concentration on the half opening 421 may be prevented and stress may be distributed to ribs. Accordingly, defects of the mask sheet 420 may be prevented and deposition quality of the display device may be improved.

According to embodiments, a mask assembly and a method of manufacturing the mask assembly, which may prevent deformation of the mask assembly to improve deposition quality and reduce a shadow phenomenon, may be provided.

The effects of the disclosure are not limited to the above-mentioned effects, and other effects not mentioned will be clearly understood by those of ordinary skill in the art from the description of the claims.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the spirit and scope of the disclosure.

What is claimed is:

1. A mask assembly comprising:
a mask frame including an opening area; and
a mask sheet disposed on the mask frame to overlap the opening area, the mask sheet including:
a first area; and
a second area surrounding the first area on all sides, wherein
the first area includes a first opening pattern that is a half-etched pattern,
the second area includes a second opening pattern that is a penetrating pattern, and
in a plan view, the first opening pattern and the second opening pattern are different from each other.

2. The mask assembly of claim 1, wherein
the first opening pattern includes:
a plurality of first ribs extending in a first direction;
a plurality of second ribs extending in a second direction; and
a plurality of half openings defined by the plurality of first ribs and the plurality of second ribs,
the second opening pattern includes:
a plurality of third ribs extending in a third direction;
a plurality of fourth ribs extending in a fourth direction; and
a plurality of openings defined by the plurality of third ribs and the plurality of fourth ribs, and
the third direction is a direction intersecting with the first direction and the second direction.

3. The mask assembly of claim 2, wherein the fourth direction is a direction intersecting with the first direction and the second direction.

4. The mask assembly of claim 2, wherein an angle between the first direction in which the plurality of first ribs extend and the third direction in which the plurality of third ribs extend is 45°.

5. The mask assembly of claim 2, wherein a direction in which the plurality of half openings are aligned and a direction in which the plurality of openings are aligned are different from each other.

6. The mask assembly of claim 5, wherein
the plurality of half openings are aligned in the first direction and the second direction, and
the plurality of openings are aligned in the third direction and the fourth direction.

7. The mask assembly of claim 2, wherein
from among distances between centers of any two half-openings among the plurality of half openings, a distance between centers of two half openings adjacent to each other in at least one of the first direction and the second direction is a shortest distance, and
from among distances between centers of any two openings among the plurality of openings, a distance between centers of two openings adjacent to each other in at least one of the third direction and the fourth direction is a shortest distance.

8. The mask assembly of claim 2, wherein, in a plan view, shapes of the plurality of half openings and shapes of the plurality of openings are different from each other.

9. The mask assembly of claim 8, wherein the shapes of the plurality of half openings are circular.

10. The mask assembly of claim 2, wherein, in a plan view, sizes of the plurality of half openings and sizes of the plurality of openings are different from each other.

11. The mask assembly of claim 2, wherein, in a plan view, a number of first ribs per unit area and a number of third ribs per unit area are different from each other.

12. The mask assembly of claim 11, wherein, in a plan view, a number of second ribs per unit area and a number of fourth ribs per unit area are different from each other.

13. A method of manufacturing a mask assembly, the method comprising:

preparing a mask sheet including:
  a first area; and
  a second area surrounding the first area on all sides;

forming a first opening pattern, which is a half-etched pattern, in the first area;

forming a second opening pattern, which is a penetrating pattern, in the second area; and tensioning the mask sheet and fixing the mask sheet onto a mask frame, wherein, in a plan view, the first opening pattern and the second opening pattern are different from each other.

14. The method of claim 13, wherein the forming of the first opening pattern includes forming a plurality of first ribs extending in a first direction, a plurality of second ribs extending in a second direction, and a plurality of half openings defined by the plurality of first ribs and the plurality of second ribs, the forming of the second opening pattern includes forming a plurality of third ribs extending in a third direction, a plurality of fourth ribs extending in a fourth direction, and a plurality of openings defined by the plurality of third ribs and the plurality of fourth ribs, and the third direction is a direction intersecting with the first direction and the second direction.

15. The method of claim 14, wherein a direction in which the mask sheet is tensioned and a direction in which the plurality of first ribs extend are same.

16. The method of claim 14, wherein a direction in which the mask sheet is tensioned is perpendicular to a direction in which the plurality of second ribs extend.

17. The method of claim 14, wherein a direction in which the mask sheet is tensioned intersects with a direction in which the plurality of third ribs extend.

18. The method of claim 17, wherein an angle between the direction in which the mask sheet is tensioned and the direction in which the plurality of third ribs extend is 45°.

19. The method of claim 14, wherein a direction in which the plurality of half openings are aligned and a direction in which the plurality of openings are aligned are different from each other.

20. The method of claim 14, wherein, in a plan view, shapes of the plurality of half openings and shapes of the plurality of openings are different from each other.

21. The method of claim 14, wherein, in a plan view, a number of first ribs per unit area and a number of third ribs per unit area are different from each other.

\* \* \* \* \*